(12) United States Patent
Peng et al.

(10) Patent No.: US 12,412,705 B2
(45) Date of Patent: Sep. 9, 2025

(54) CAPACITOR STRUCTURE, SEMICONDUCTOR STRUCTURE, AND METHOD FOR MANUFACTURING THE SAME

(71) Applicant: TAIWAN SEMICONDUCTOR MANUFACTURING COMPANY LTD., Hsinchu (TW)

(72) Inventors: Liang-Shiuan Peng, Taipei (TW); Chih Hung Lu, Hsinghu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 428 days.

(21) Appl. No.: 18/155,761

(22) Filed: Jan. 18, 2023

(65) Prior Publication Data

US 2024/0170223 A1     May 23, 2024

Related U.S. Application Data

(60) Provisional application No. 63/384,231, filed on Nov. 18, 2022.

(51) Int. Cl.
  *H01G 4/33* (2006.01)
  *H01G 4/08* (2006.01)

(52) U.S. Cl.
  CPC ............... *H01G 4/33* (2013.01); *H01G 4/08* (2013.01)

(58) Field of Classification Search
  None
  See application file for complete search history.

(56) References Cited

U.S. PATENT DOCUMENTS

| | | | |
|---|---|---|---|
| 2017/0125405 A1* | 5/2017 | Tanaka | H05K 1/18 |
| 2019/0189735 A1* | 6/2019 | Li | H10D 1/714 |
| 2020/0043660 A1* | 2/2020 | Laaser | H01G 4/255 |
| 2020/0066443 A1* | 2/2020 | Lu | H01G 4/008 |
| 2020/0343049 A1* | 10/2020 | Paital | H01G 4/38 |
| 2023/0011605 A1* | 1/2023 | Singh | H10D 1/042 |
| 2023/0012211 A1* | 1/2023 | Jo | H10D 1/042 |

* cited by examiner

*Primary Examiner* — Alexander G Ghyka
(74) *Attorney, Agent, or Firm* — WPAT LAW; Anthony King

(57) ABSTRACT

A method for manufacturing a semiconductor structure is provided. A first plate, a second plate, and a third plate are sequentially formed over a substrate. The first plate includes a first top surface, first sidewalls and first transition regions, wherein the first transition regions connect the first sidewalls to the first top surface. The second plate includes a second top surface, second sidewalls and second transition regions, wherein the second transition regions connect the second sidewalls to the second top surface, and the first transition regions are covered by the second plate. The third plate includes a third top surface, third sidewalls and third transition regions, wherein the third transition regions connect the third sidewalls to the third top surface, and the second transition regions are exposed by the third plate. A semiconductor structure thereof is also provided.

20 Claims, 28 Drawing Sheets

CAPACITOR STRUCTURE, SEMICONDUCTOR STRUCTURE, AND METHOD FOR MANUFACTURING THE SAME

PRIORITY CLAIM AND CROSS-REFERENCE

This application claims the benefit of prior-filed provisional application No. 63/384,231, filed on 18 Nov. 2022.

BACKGROUND

Semiconductor devices are used in a variety of electronic applications, such as personal computers, cellular phones, digital cameras, and other electronic equipment. The semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, issues of current leakage and breakdown voltage of a capacitor have arisen.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

DETAILED DESCRIPTION

Figure 1:
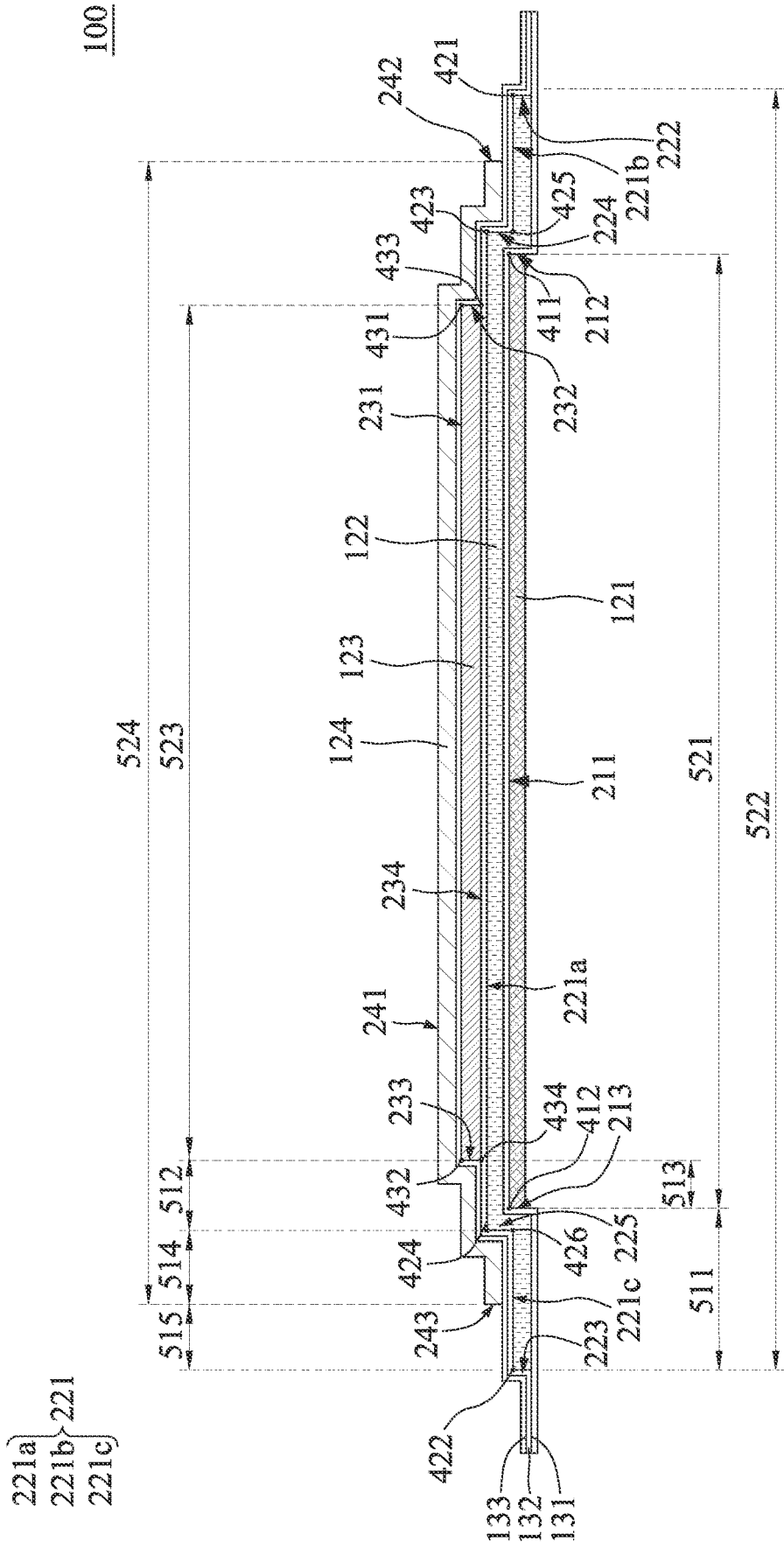
FIG. 1 is a schematic cross-sectional diagram of a plate capacitor in accordance with some embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context. In addition, the term "source/drain region" or "source/drain regions" may refer to a source or a drain, individually or collectively dependent upon the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from normal deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A plate capacitor is commonly used in a semiconductor device and includes two parallel plate electrodes separated by an insulator. There are many indicators that can be used to determine quality and performance of a plate capacitor, such as current leakage, time-dependent dielectric breakdown (TDDB), and breakdown voltage (VBD). However, it is difficult to achieve low current leakage and good TDDB and VBD at the same time. The present disclosure provides a structure of a plate capacitor having a low current leakage and good TDDB and VBD.

FIG. 1 is a schematic cross-sectional diagram of a plate capacitor 100 in accordance with some embodiments of the present disclosure. The plate capacitor 100 may include multiple conductive plates separated by multiple high-k dielectric layers. In some embodiments, the plate capacitor 100 includes a first plate 121, a second plate 122, a third plate 123, and fourth plate 124 stacked in sequence. In some embodiments, a first high-k dielectric layer 131 is disposed between the first plate 121 and the second plate 122. In some embodiments, a second high-k dielectric layer 132 is disposed between the second plate 122 and the third plate 123. In some embodiments, a third high-k dielectric layer 133 is disposed between the third plate 123 and the fourth plate 124. In some embodiments, a first width 521 of the first plate 121 is less than a second width 522 of the second plate 122. In some embodiments, a third width 523 of the third plate 123 is less than the first width 521. In some embodiments, a fourth width 524 of the fourth plate 124 is greater than the first width 521 and less than the second width 522.

Each of the plates 121, 122, 123 and 124 includes multiple corners or transition regions. A transition region may represent a region connecting a sidewall to a top surface. In some embodiments, the corner refers to a point having a minimum radius of curvature in the transition region. In some embodiments, when the transition region is an intersecting point of the sidewall and the top surface, the transition region may be referred to as a corner as shown in FIG. 1.

The first plate 121 may include a top surface 211, a pair of sidewalls 212 and 213, and corners 411 and 412. In some embodiments, the corner 411 connects the top surface 211 and the sidewall 212, and the corner 412 connects the top surface 211 and the sidewall 213. In some embodiments, the first plate 121 includes the first width 521 between the sidewalls 212 and 213, wherein the sidewalls 212 and 213 define boundaries of the first plate 121 (details and reference to a corresponding top view diagram are provided in the following description). In some embodiments, the first high-k dielectric layer 131 covers and is conformal to the first plate 121.

The second plate 122 covers and is conformal to the first plate 121. The second plate 122 has a stair or stepped configuration, wherein a portion of the second plate 122 is vertically over the first plate 121 and a portion of the second plate 122 is horizontally extending from or aligned with the first plate 121. The second plate 122 may include a top surface 221, a pair of sidewalls 222 and 223 at a first elevation same as the first plate 121, a pair of sidewalls 224 and 225 at a second elevation over the first plate 121, and corners 421, 422, 423, 424, 425 and 426. The top surface 221 may include a first portion 221a at a first step of the second plate 122 and a second portion 221b and a third portion 221c at a second step of the second plate 122. In some embodiments, the corner 423 connects the first portion 221a of the top surface 221 and the sidewall 224, and the corner 424 connects the first portion 221a of the top surface 221 and the sidewall 225. In some embodiments, the corner 421 connects the second portion 221b of the top surface 221 and the sidewall 222, and the corner 422 connects the third portion 221c of the top surface 221 and the sidewall 223. In some embodiments, the corner 425 connects the sidewall 224 and the second portion 221b of the top surface 221, and the corner 426 connects the sidewall 225 and the third portion 221c of the top surface 221.

The second plate 122 includes the second width 522 between the sidewalls 222 and 223, wherein the sidewalls 222 and 223 define boundaries of the second plate 122 (details and reference to a corresponding top view diagram are provided in the following description). The second plate 122 at least covers the corners 411 and 412 of the first plate 121. In some embodiments, the second plate 122 covers an entirety of the sidewalls 212 and 213 of the first plate 121. In order to ensure that the second plate 122 covers an entirety of the top surface 211 and the corners 411 and 412, and in consideration of a necessary processing tolerance of an etching operation, the second plate 122 is designed to have a width 511 of the second step of the stair configuration of the second plate greater than zero. In some embodiments, the width 511 of the second step (or portion) of the second plate 122 extending from the sidewalls 212 and 213 of the first plate 121 is substantially equal to or greater than 0.2 microns (μm). In some embodiments, the second high-k layer 132 covers the second plate 122, and a profile of the second high-k layer 132 is conformal to that of the second plate 122. In some embodiments, the second high-k layer 132 contacts the first high-k layer 131.

The third plate 123 covers a portion of the second plate 122 and overlaps a portion of the first plate 121. The third plate 123 may include a top surface 231, a bottom surface 234, a pair of sidewalls 232 and 233, and corners 431, 432, 433 and 434. In some embodiments, the corners 431 and 432 are two opposite upper corners of the third plate 123, and the corners 433 and 434 are two opposite lower corners of the third plate 123. In some embodiments, the corner 431 connects the top surface 231 and the sidewall 232, and the corner 432 connects the top surface 231 and the sidewall 233. In some embodiments, the corner 433 connects the bottom surface 234 and the sidewall 232, and the corner 434 connects the bottom surface 234 and the sidewall 233. The third plate 123 includes the third width 523 between the sidewalls 232 and 233, wherein the sidewalls 232 and 233 define boundaries of the third plate 123 (details and reference to a corresponding top view diagram are provided in the following description). In some embodiments, the third width 523 of the third plate 123 is less than the second width 522 of the second plate 122.

In some embodiments, the third plate 123 is within a coverage area of the first plate 121. In some embodiments, the sidewalls 232 and 233 of the third plate 123 are disposed over the top surface 211 of the first plate 121 and offset from the sidewalls 212 and 213 respectively. In some embodiments, the corner 434 of the third plate 123 and the corner 412 of the first plate 121 are separated by a horizontal distance 513. In some embodiments, the distance 513 is in a range of 0.05 to 0.15 μm. In an advanced technology node of a semiconductor structure, a thickness of a negative electrode (e.g., the second plate 122) or thicknesses of dielectric layers (e.g., 131 and 132) between two adjacent positive electrodes (e.g., the first plate 121 and the third plate 123) can be very small. In other words, a vertical distance between boundaries of adjacent positive electrodes can be very small, which can result in current leakage if the boundaries of the two adjacent positive electrodes are too close since electric charges are easily to accumulate at edges or corners of a plate. The distance 513 between a lower corner (e.g., the corner 434 or 433) of the third plate 123 and a corresponding upper corner (e.g., the corner 412 or 411) of the first plate 121 is for a purpose of prevention of the current leakage between the boundaries of the two adjacent positive electrodes. In some embodiments, a distance 512 between the corner 434 of the third plate 123 and the corner 424 of the second plate 122 is substantially equal to a total amount of the width 513 and a thickness of the second plate 122.

In some embodiments, the third high-k layer 133 covers the third plate 123, and a profile of the third high-k layer 133 is conformal to those of the third plate 123 and the second plate 122. In some embodiments, the third high-k layer 133 contacts the second high-k layer 132. In some embodiments, the third high-k layer 133 covers an entirety of portions of the second plate 122 not covered by the third plate 123.

The fourth plate 124 covers and is conformal to the third plate 123. In some embodiments, the fourth plate 124 covers a portion of the second plate 122 not covered by the third plate 123. Therefore, the fourth plate 124 has a stair or stepped configuration. In some embodiments, the fourth plate 124 includes the fourth width 524 between sidewalls 242 and 243 of the fourth plate 124, wherein the sidewalls 242 and 243 define boundaries of the fourth plate 124 (details and reference to a corresponding top view diagram are provided in the following description). In some embodiments, the fourth width 524 of the fourth plate 124 is greater than the first width 521 of the first plate 121 and less than the second width 522 of the second plate 122. The fourth plate 124 at least covers an entirety of the third plate 123. In some embodiments, the fourth plate 124 covers the corners 425 and 426 of the second plate 122. It has been found that subsequent processing of manufacturing a semiconductor device may damage portions of the high-k layers (e.g., 131, 132 and 133) exposed to a processing environment, and qualities of portions of the high-k layers covering corners (e.g., 425 and 426) of a conductive plate can be difficult to control. Therefore, the coverage by the fourth plate 124 of the corners 425 and 426 can prevent damage to the high-k layers by the subsequent processing, and quality and performance of the plate capacitor 100 can be improved. In some embodiments, in order to ensure that the fourth plate 124 covers the corner 425 and 426, a horizontal distance 514 between boundaries of the fourth plate 124 and the corners 425 and 426 is substantially greater than 0.1 μm.

For a purpose of controlling a distance between adjacent plate capacitors, the fourth plate 124 is designed to be smaller than the second plate 122 so that a width of the plate capacitor 100 can be defined by the second plate 122. In other words, the distance 514 should be less than the width 511. In some embodiments, a distance 515 between the boundary (e.g., the sidewall 243 in the embodiment shown in FIG. 1) of the fourth plate 124 and the corner 422 of the second plate 122 is substantially greater than 0.05 μm.

It has been found that current leakage and electric breakdown are likely to occur at corners of a conductive plate, especially the conductive plate having a higher electric potential of a plate capacitor due to an effect of tip discharge. Although current leakage may decrease a performance (e.g., capacitance) of a plate capacitor, it can improve TDDB and VBD of the plate capacitor. On the other hand, effective prevention of current leakage may lead to current flowing in dielectric materials of the plate capacitor and result in a reduction of the TDDB and VBD of the plate capacitor. From a structural perspective, a coverage of an upper plate on upper corners of a lower plate can provide better prevention of current leakage, but also results in reduction of TDDB or VBD. In addition, exposure of lower corners of the lower plate through the upper plate may increase the current leakage due to damaged dielectric layers from a patterning operation of the upper plate and other manufacturing processes.

A traditional plate capacitor includes plates with all corners exposed or all corners covered, and thus the transitional plate capacitor has either a greater current leakage or a poor TDDB/VBD performance. The present disclosure provides a plate capacitor including sequentially formed conductive plates, wherein the conductive plates include at least three conductive plates stacked in sequence. The conductive plates include one or more large plates and one or more small plates alternately arranged in a stacking direction. In addition, sizes of the large plates progressively decrease toward a top of the plate capacitor along a vertical direction; and similarly, sizes of the small plates progressively decrease toward the top of the plate capacitor along the vertical direction. For instance, as shown in FIG. 1, the second width 522 of the second plate 122 is greater than the first width 521 of the first plate 121; the third width 523 of the third plate 123 is less than the second width 522 of the second plate 122; and the fourth width 524 of the fourth plate 124 is greater than the third width 523 of the third plate 123 or the first width 521 of the first plate 121 and less than the second width 522 of the second plate 122. The plate capacitor of the present disclosure includes multiple conductive plates having at least some exposed corners and some covered corners, and thus issues of current leakage and TDDB/VBD performance can be balanced. Therefore, overall performance of the plate capacitor of the present disclosure can optimized.

Figure 2:
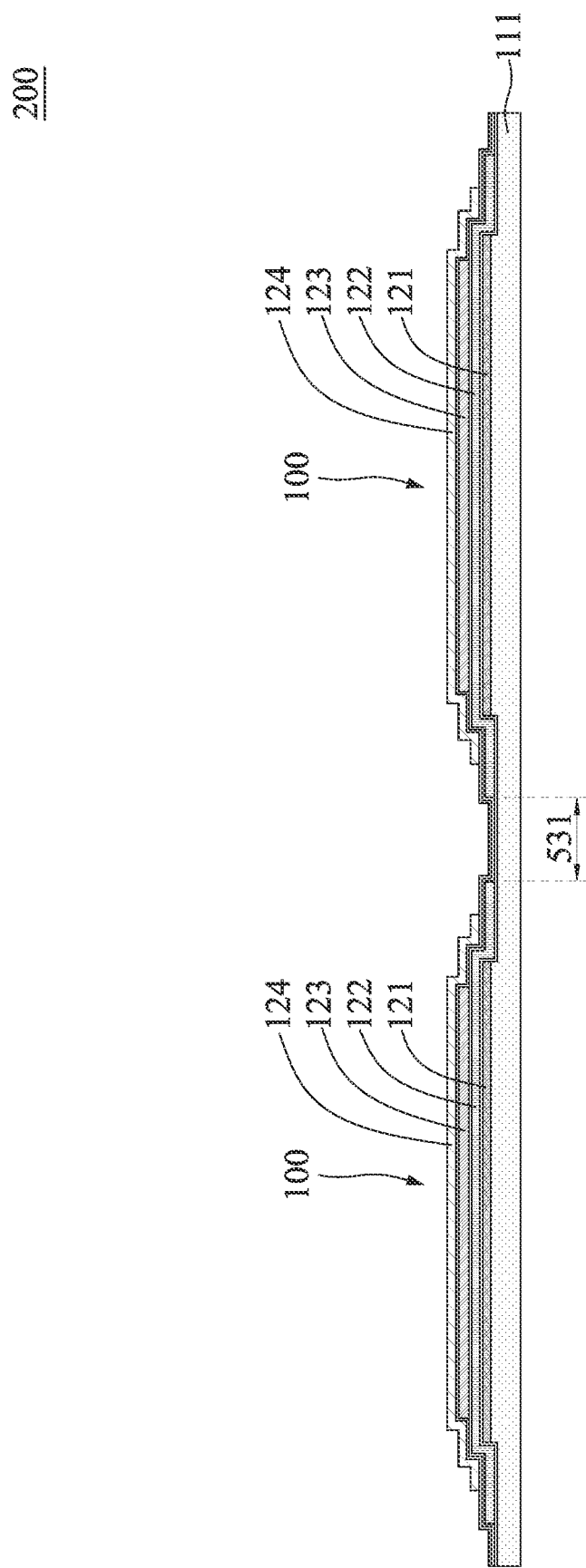
FIGS. 2 and 3 are schematic cross-sectional diagrams of semiconductor structures including one or more plate capacitors in accordance with different embodiments of the disclosure.

FIG. 2 is a schematic cross-sectional diagram of a semiconductor structure 200 including multiple plate capacitors 100 shown in FIG. 1 in accordance with some embodiments of the present disclosure. One or more plate capacitors 100 can be applied in a semiconductor device, for instance, over a substrate 111. As shown in FIG. 2 and described above, a distance 531 between adjacent plate capacitors 100 is controlled and defined by a distance between adjacent first plates 121 of the plate capacitors 100. Sizes (or widths) of all plates are smaller (or less) than that of a first large plate over the substrate 111, and thus, spaces (or pitches) between multiple plate capacitors can be effectively controlled, especially from a manufacturing point of view. The distance 531 can be adjusted according to different requirements, and is not limited herein. In some embodiments, the distance 531 is greater than 0.5 µm.

Figure 3:
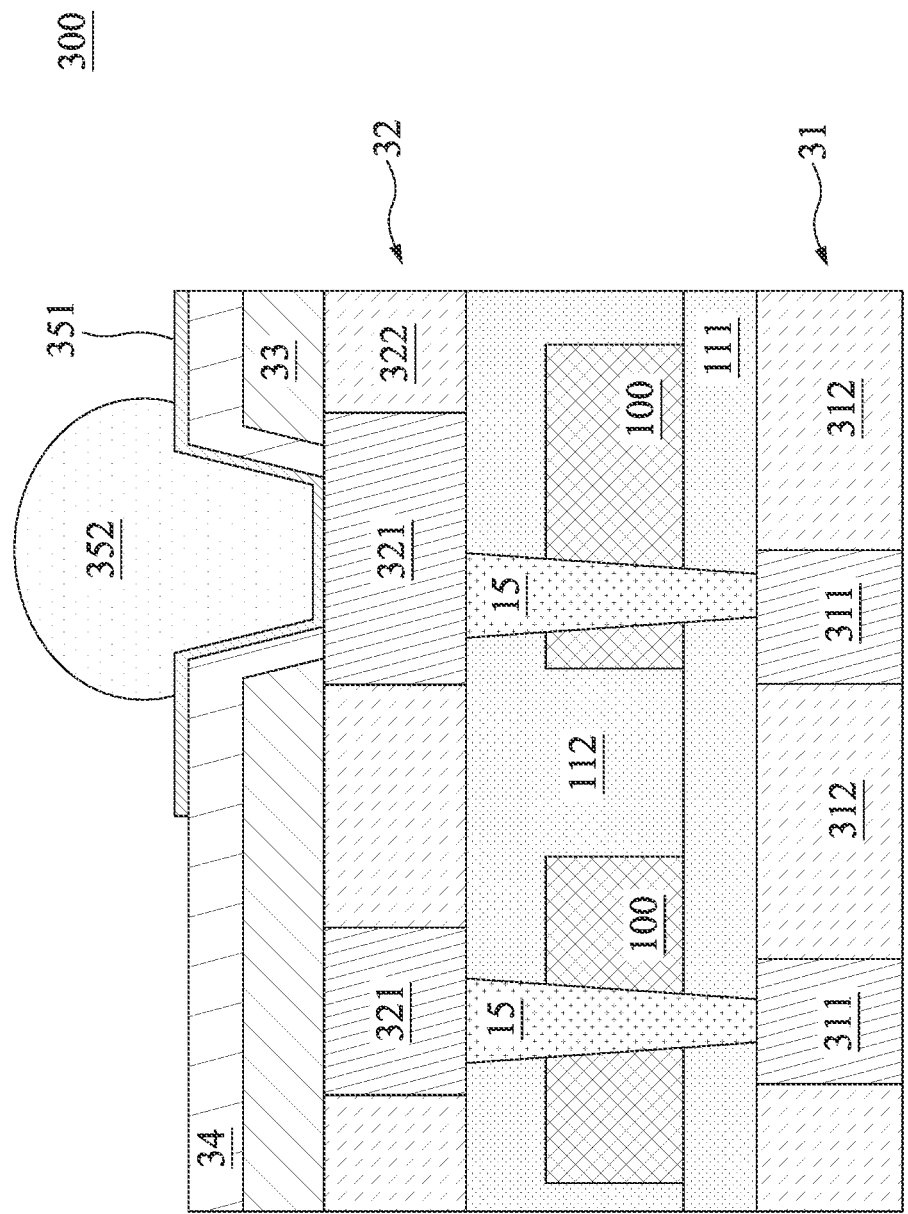

FIG. 3 is a schematic cross-sectional diagram of at least one plate capacitor 100 shown in FIG. 1, applied in a semiconductor structure 300 in accordance with some embodiments of the present disclosure. In some embodiments, the substrate 111 is one of multiple dielectric layers of a semiconductor substrate. In some embodiments, the substrate 111 is an interlayer dielectric (ILD) layer of an interconnect structure disposed over a circuit. In some embodiments, the circuit can include one or more transistors, active components, and/or passive components. In some embodiments, the substrate 111 referred to an entirety of multiple layers disposed under the plate capacitors of the present disclosure. In other words, the substrate 111 includes a top metal layer 31 of the interconnect structure and a dielectric (or insulating) layer disposed thereover, wherein the dielectric layer is a topmost layer of the substrate 111. In some embodiments, the top metal layer 31 include an ILD layer 312 and a plurality of metal lines 311 surrounded by the ILD layer 312. In some embodiments, the plate capacitors 100 are covered by an insulating layer 112. The semiconductor structure 300 may further include a redistribution layer (RDL) 32 disposed over the interconnect structure and the plate capacitors 100. In some embodiments, the RDL 32 includes a dielectric layer 322 and a plurality of conductive patterns 321. In some embodiments, the plate capacitors 100 are individually electrically connected to the metal lines 311 and the conductive patterns 321 through conductive plugs 15. The semiconductor structure 300 may further include a passivation layer 33 and a polyimide layer 34 over the RDL 32. The passivation layer 33 can be a single-layer or a multilayer structure, and is not limited herein. The plate capacitors 100 may be electrically connected to another device, chip, or die through a connector 35. In some embodiments, the connector 35 includes a conductive pad (e.g., an aluminum pad) 351 and a conductive bump 352 (e.g., a solder bump) as shown in FIG. 3.

The present disclosure further provides a method for manufacturing a semiconductor structure such as those illustrated above. FIGS. 4 to 18 are schematic diagrams of a semiconductor structure at different stages of the method. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to form different combinations of embodiments as long as the parameters or conditions used are not in conflict.

Figure 4:
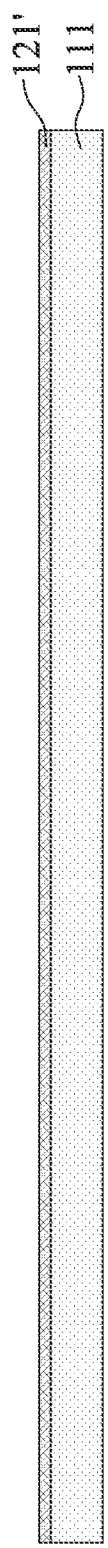
FIGS. 4 to 5, 7 to 8, and 10 to 14 are schematic cross-sectional diagrams at different stages of a method of manufacturing a semiconductor structure in accordance with some embodiments of the disclosure.

Referring to FIG. 4, a first conductive material 121' is formed over a substrate 111. In some embodiments, the substrate 111 can be a dielectric layer. The first conductive material 121' can be formed by physical vapor deposition (PVD), chemical vapor deposition (CVD), plasma-enhanced CVD (PECVD), atomic layer deposition (ALD), or any other suitable process. In some embodiments, the first conductive material 121' covers an entirety of the substrate 111. The first conductive material 121' may include one or more suitable conductive materials. In some embodiments, the first conductive material 121' includes a conductive material selected from a group of tungsten (W), aluminum (Al), copper (Cu), silver (Ag), gold (Au), titanium (Ti), tantalum (Ta), ruthenium (Ru), titanium nitride (TiN), tantalum nitride (TaN), ruthenium nitride (RuN), tungsten nitride (WN), nickel (Ni), cobalt (Co), iron (Fe), chromium (Cr), iron-nickel (Fe—Ni) alloy, alloys thereof, and combinations thereof.

Figure 5:
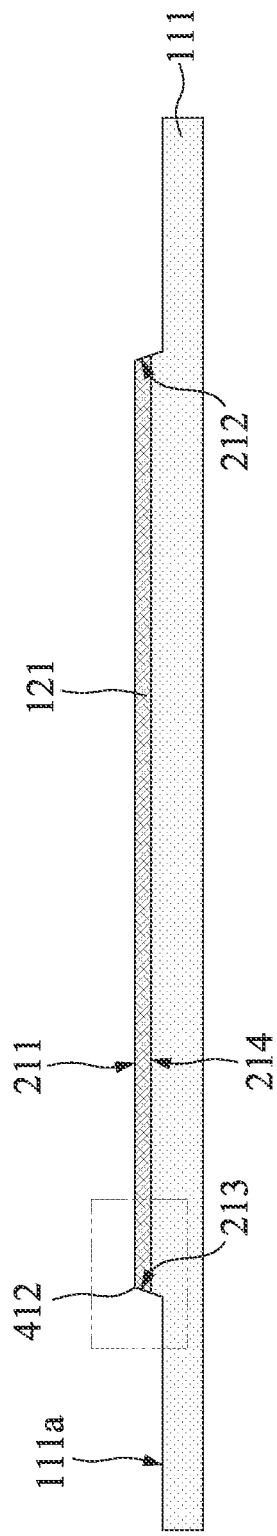

Referring to FIG. 5, the first conductive material 121' is patterned to form a first plate 121 over the substrate 111. In some embodiments, an etching operation is performed to remove portions of the first conductive material 121', thereby forming the first plate 121. In some embodiments, a thickness of the first plate 121 is in a range of 100 to 800 angstroms (Å). Sidewalls 212 and 213 of the first plate 121 can be vertical as shown in FIG. 1 or tilted as shown in FIG. 5, depending on the etching operation. Residual particles may easily collect at sharp corners, and the tilted sidewalls 212 and 213 as shown in FIG. 5 can prevent residues at corners between the first plate 121 and the substrate 111. In addition, a surface 111a of the substrate 111 exposed by the first plate 121 can be a planar surface substantially aligned with a bottom surface 214 of the first plate as shown in FIG. 1, or a recessed (or indented) surface as shown in FIG. 5 due to an over-etching effect of the etching operation. In some embodiments, the substrate 111 is over-etched by the etching operation to ensure that the portions of first conductive material 121' are removed. A surficial portion of the substrate 111 exposed by the first plate 121 is removed as shown in FIG. 5. The recessed surface 111a of the substrate 111 is thereby formed by the etching operation as shown in FIG. 5.

Figure 6:
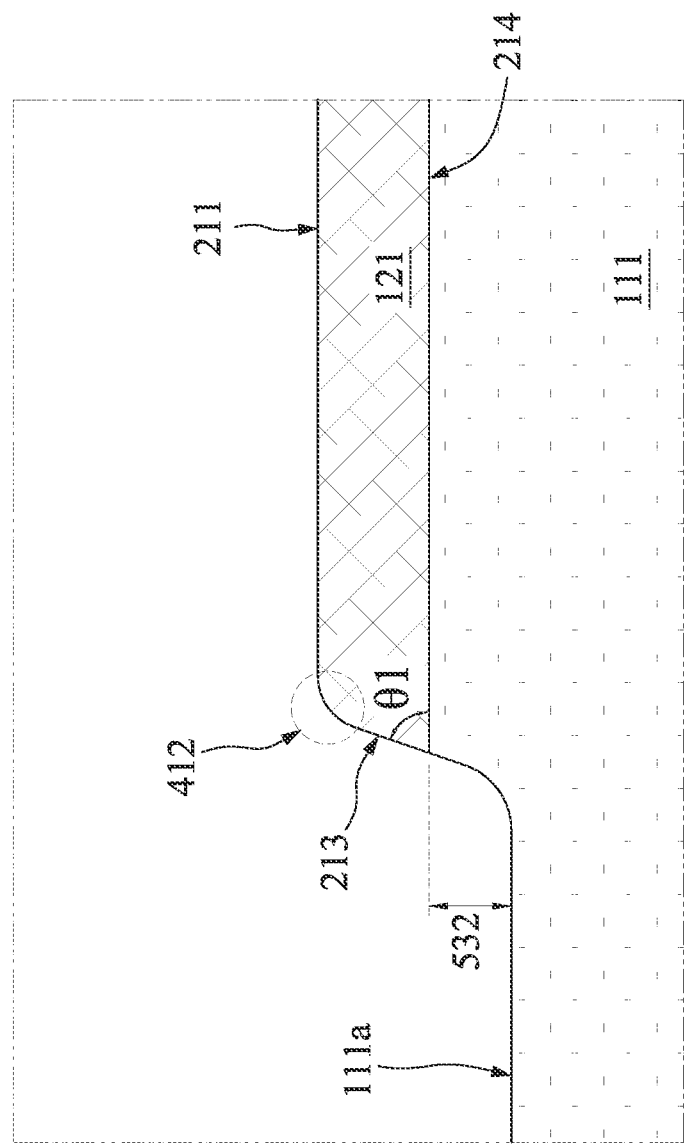
FIG. 6 is a schematic enlarged diagram of a portion of the intermediate structure indicated by dotted lines in FIG. 5 in accordance with some embodiments of the present disclosure.

Referring to FIG. 6, a schematic enlarged diagram of a portion of the intermediate structure indicated by dotted lines in FIG. 5 is provided in accordance with some embodiments of the present disclosure. In some embodiments, the sidewall 213 is tilted to the bottom surface 214 of the first plate 121. In some embodiments, an elevation angle θ1 of the sidewall 213 is in a range of 30 to 70 degrees. A corner 412 between a top surface 211 and the sidewall 213 can be a sharp corner as shown in FIG. 5 or a rounded corner as shown in FIG. 6. In some embodiments, the corner 412 is referred to as a transition region 412. In some embodiments, the top surface 211 and the sidewall 213 are planar surfaces, and the transition region 412 includes a curved surface connecting the top surface 211 to the sidewall 213. In some embodiments, the patterning operation conducted on the first conductive material as shown in FIG. 5 includes a dry-etching operation. In some embodiments, the patterning operation includes a time-mode etching operation. In some embodiments, the dry-etching operation is performed for a certain duration of time in order to control a depth 532 of the recessed surface 111a of the substrate 111. In some embodiments, the depth 532 is in a range of 50 to 300 Å.

Figure 7:
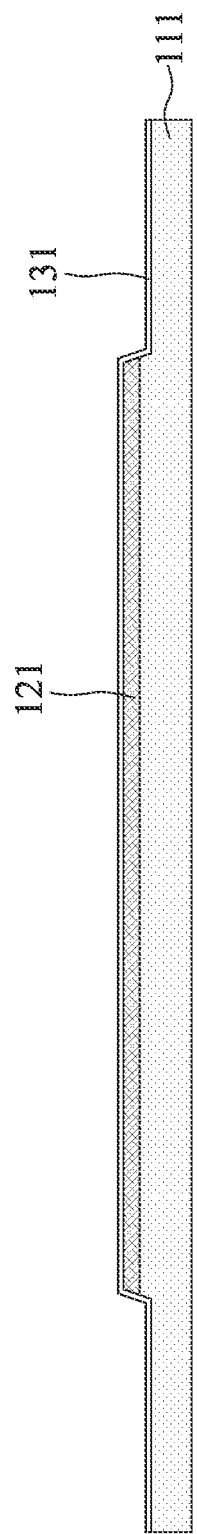

Referring to FIG. 7, a first dielectric layer 131 is formed over and conformal to the first plate 121 and the substrate 111. In some embodiments, the first dielectric layer 131 can be formed by PVD, CVD, PECVD, ALD, or any other suitable process. In some embodiments, a thickness of the first dielectric layer 131 is in a range of 10 to 200 Å. In some embodiments, the first dielectric layer 131 includes oxide, nitride, oxynitride, high-k dielectric materials, or a combination thereof. The high-k dielectric materials may include zirconium dioxide ($ZrO_2$), hafnium oxide ($HfO_2$), aluminum oxide ($Al_2O_3$), yttrium oxide ($Y_2O_3$), lanthanum oxide ($La_2O_3$), silicates of one or more of $ZrO_2$, $HfO_2$, $Al_2O_3$, $Y_2O_3$ and $La_2O_3$, aluminates of one or more of $ZrO_2$, $HfO_2$, $Y_2O_3$ and $La_2O_3$, tantalum oxide ($Ta_2O_5$), barium titanate ($BaTiO_3$), titanium dioxide ($TiO_2$), cerium oxide ($CeO_2$), lanthanum aluminum oxide ($LaAlO_3$), lead titanate (Pb-$TiO_3$), strontium titanate ($SrTiO_3$), lead zirconate ($PbZrO_3$), tungsten oxide ($WO_3$), bismuth silicon oxide ($Bi_4Si_2O_{12}$), barium strontium titanate (BST) ($Ba_{1-x}Sr_xTiO_3$), PMN (PbMg$_x$Nb$_{1-x}$O$_3$), PZT (PbZr$_x$Ti$_{1-x}$O$_3$), PZN (PbZn$_x$Nb$_{1-x}$O$_3$), PST (PbSc$_x$Ta$_{1-x}$O$_3$), hafnium zirconium oxide (Hf$_x$Zr$_y$O$_z$), hafnium zirconium aluminum oxide (Hf$_w$Zr$_x$-Al$_y$O$_z$), lithium oxide (Li$_2$O), hafnium silicon oxide (Hf-SiO$_4$), strontium oxide (SrO), scandium oxide (Sc$_2$O$_3$), molybdenum trioxide (MoO$_3$), barium oxide (BaO), or a combination thereof. In some embodiments, the first dielectric layer 131 does not include aluminum. In some embodiments, the first dielectric layer 131 is referred to as a first high-k layer 131. In some embodiments, the first dielectric layer 131 is formed across an entirety of the substrate 111.

Figure 8:
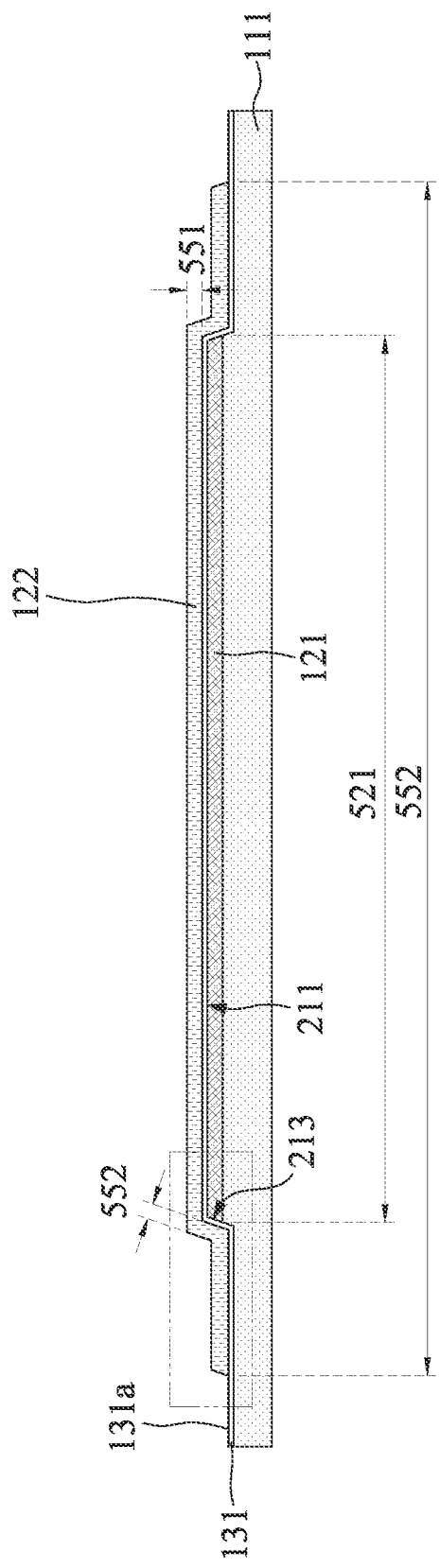

Referring to FIG. 8, operations as depicted in FIGS. 4 and 5 are performed on the intermediate structure shown in FIG. 7, and a second plate 122 is formed over the first plate 121. The second plate 122 has a width 522 greater than a width 521 of the first plate 121 and covers sidewalls (or edges) of the first plate 121. The second plate 122 may cover an entirety of the sidewalls of the first plate 121. In some embodiments, materials of the second plate 122 include one or more materials of the first plate 121 as listed above, and repeated description is omitted herein. The material of the second plate 122 can be the same as or different from that of the first plate 121 depending on requirements. A thickness of a horizontal portion of the second plate 122 may be different from a thickness of a vertical portion of the second plate 122 due to a property of a deposition. In some embodiments, a first portion of the second plate 122 on the top surface 211 has a thickness 551 being substantially greater than a thickness 552 of a second portion of the second plate 122 over the sidewall 213 of the first plate 121. In some embodiments, the thickness 551 is in a range of 100 to 800 Å, and the thickness 552 is substantially less than the thickness 551. In some embodiments, the thickness 552 is about 50 to 95% of the thickness 551 depending on the elevation angle θ1 shown in FIG. 6.

Figure 9:
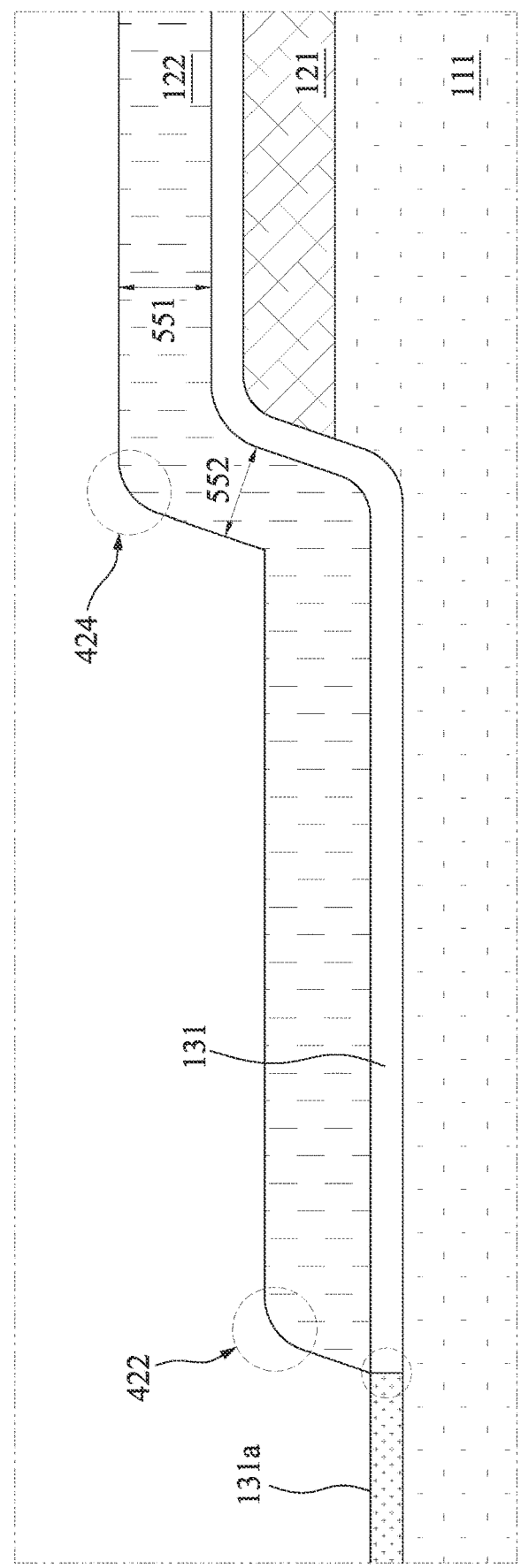
FIG. 9 is a schematic enlarged diagram of a portion of the intermediate structure indicated by dotted lines in FIG. 8 in accordance with some embodiments of the present disclosure.

Referring to FIG. 9, a schematic enlarged diagram of a portion of the intermediate structure indicated by dotted lines in FIG. 8 is provided in accordance with some embodiments of the present disclosure. Portions of the first dielectric layer 131 exposed by the second plate 122 may be damaged by a patterning operation during the formation of the second plate 122. A portion 131a of the first dielectric layer 131 exposed by the second plate 122 as shown in FIG. 9 can be damaged, and a quality of the portion 131a of the first dielectric layer 131 is reduced. The portion 131a may not affect a performance of a plate capacitor to be formed when an edge or a lower corner (as indicated by a dotted circle) is not covered by or overlapping another conductive plate (or another electrode of the capacitor). On the other hand, a damaged portion of a dielectric layer can result in an issue of current leakage through a corner of a conductive plate above an interface of the damaged portion and an undamaged portion of the dielectric layer when the corner of the conductive plate is covered by (or overlapping) an adjacent conductive plate having a different electrical potential.

Similar to the first plate 121, the second plate 122 may have rounded corners (e.g., corners 422 and 424) as shown in FIG. 9 as a result of an etching operation during the formation of the second plate 122. Repeated description is omitted herein. It should be noted that, in the figures and the disclosure, only a sidewall or a side of corners of a conductive plate are illustrated for a purpose of simplicity. It can be understood that other sidewalls or other corners of a conductive plate may have similar or same conditions since they are formed concurrently by a same process.

Figure 10:
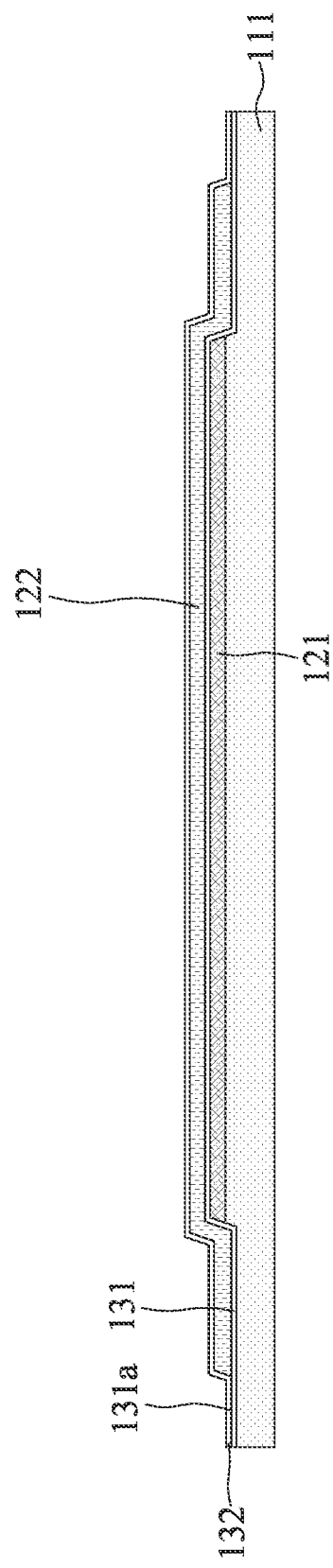

Referring to FIG. 10, a second dielectric layer 132 is formed over and conformal to the second plate 122 and the substrate 111. In some embodiments, the second dielectric layer 132 can be formed by PVD, CVD, PECVD, ALD, or any other suitable process. In some embodiments, a thickness of the second dielectric layer 132 can be substantially equal to or different from that of the first dielectric layer 131 depending on requirements. In some embodiments, the thickness of the second dielectric layer 132 is in a range of 10 to 200 Å. In some embodiments, a material of the second dielectric layer 132 includes one or more materials in the selection of the first dielectric layer 131 as listed above, and repeated description is omitted herein. In some embodiments, the second dielectric layer 132 does not include aluminum. In some embodiments, the second dielectric layer 132 is referred to as a second high-k layer 132. In some embodiments, the second dielectric layer 132 contacts the first dielectric layer 131. More specifically, the second dielectric layer 132 contacts the portion 131a of the first dielectric layer 131. In some embodiments, the second dielectric layer 132 is formed across the entire substrate 111.

Figure 11:
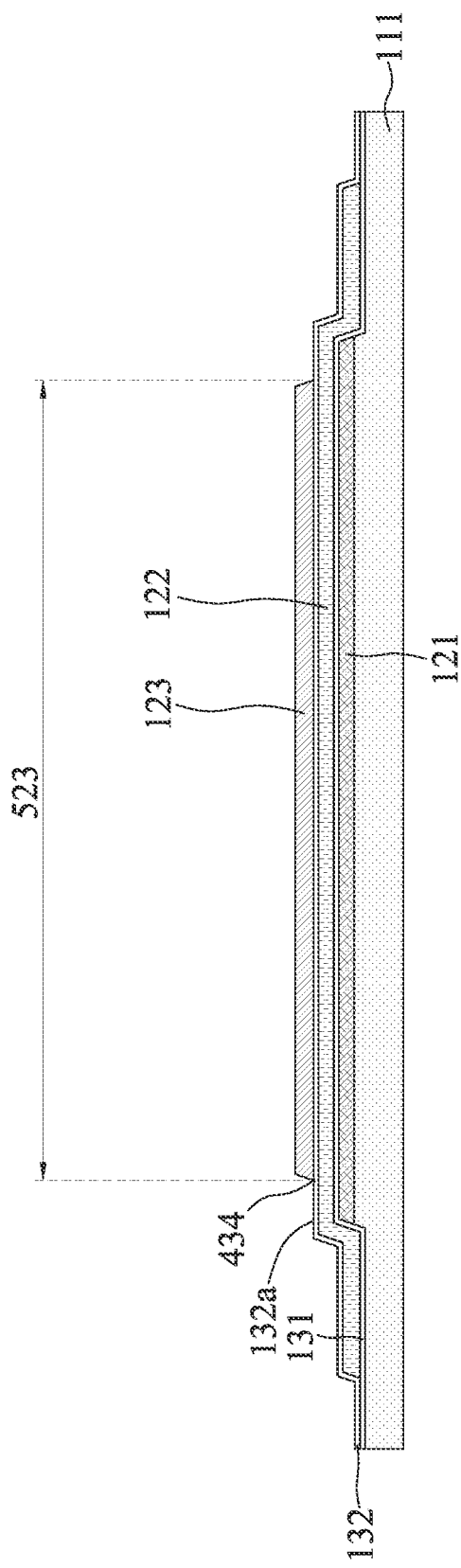

Referring to FIG. 11, operations as depicted in FIG. 8 are performed on the intermediate structure shown in FIG. 10, and a third plate 123 is formed over the second plate 122. The third plate 123 has a width 523 less than that of the second plate 122, and the third plate 123 covers only a portion of the second plate 122. In some embodiments, the width 523 is acquired, defined, or determined prior to a patterning operation during the formation of the third plate 123. In some embodiments, the width 523 is less than that of the first plate 121 and the third plate 123 overlaps only a portion of the first plate 121. Differences between the widths 521, 522 and 523 are as illustrated in FIG. 1, and repeated description is omitted herein. In some embodiments, a portion 132a of the second dielectric layer 132 exposed by the third plate 123 is damaged by an etching operation during the formation of the third plate 123. The portion 132a of the second dielectric layer 132 exposed by the third plate 123 results in a possible pathway of current leakage between the second plate 122 and the third plate 123, especially at a lower corner 434 of the third plate 434 which is adjacent to an interface of the damaged portion 132a and an undamaged portion of the second dielectric layer 132 covered by the third plate 123 (as indicated by a dotted circle).

Figure 12:
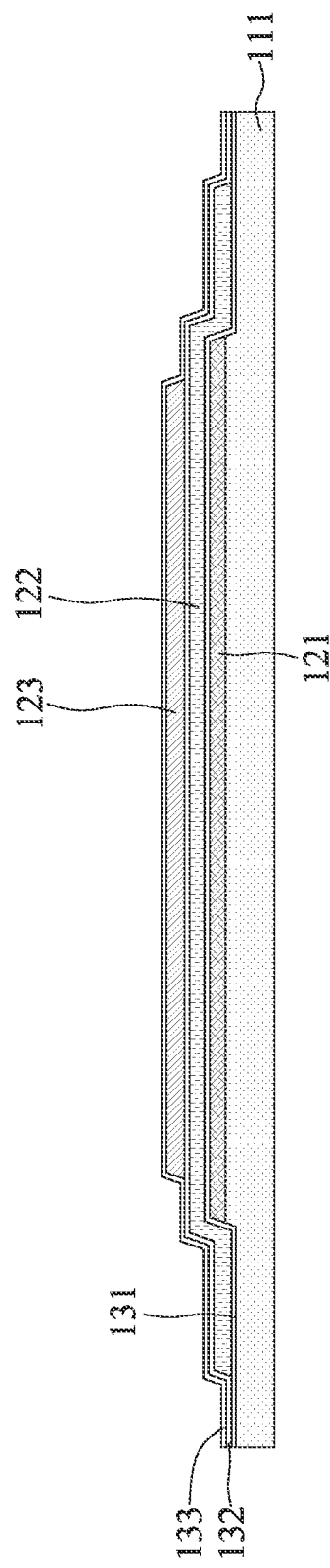

Referring to FIG. 12, a third dielectric layer 133 is formed over and conformal to the third plate 123, the second plate 122 and the substrate 111. In some embodiments, the third dielectric layer 133 can be formed by PVD, CVD, PECVD, ALD, or any other suitable process. In some embodiments, a thickness of the third dielectric layer 133 can be substantially equal to or different from those of the first dielectric layer 131 or the second dielectric layer 132, depending on requirements. In some embodiments, the thickness of the third dielectric layer 133 is in a range of 10 to 200 Å. In some embodiments, a material of the third dielectric layer 133 includes one or more of the materials in the selection of the first dielectric layer 131 as listed above, and repeated description is omitted herein. In some embodiments, the third dielectric layer 133 does not include aluminum. In some embodiments, the third dielectric layer 133 is referred to as a third high-k layer 133. In some embodiments, the third dielectric layer 133 contacts the second dielectric layer 132. More specifically, the third dielectric layer 133 contacts the portion 132a of the second dielectric layer 132. In some embodiments, the third dielectric layer 133 is formed across the entire substrate 111.

Figure 13:
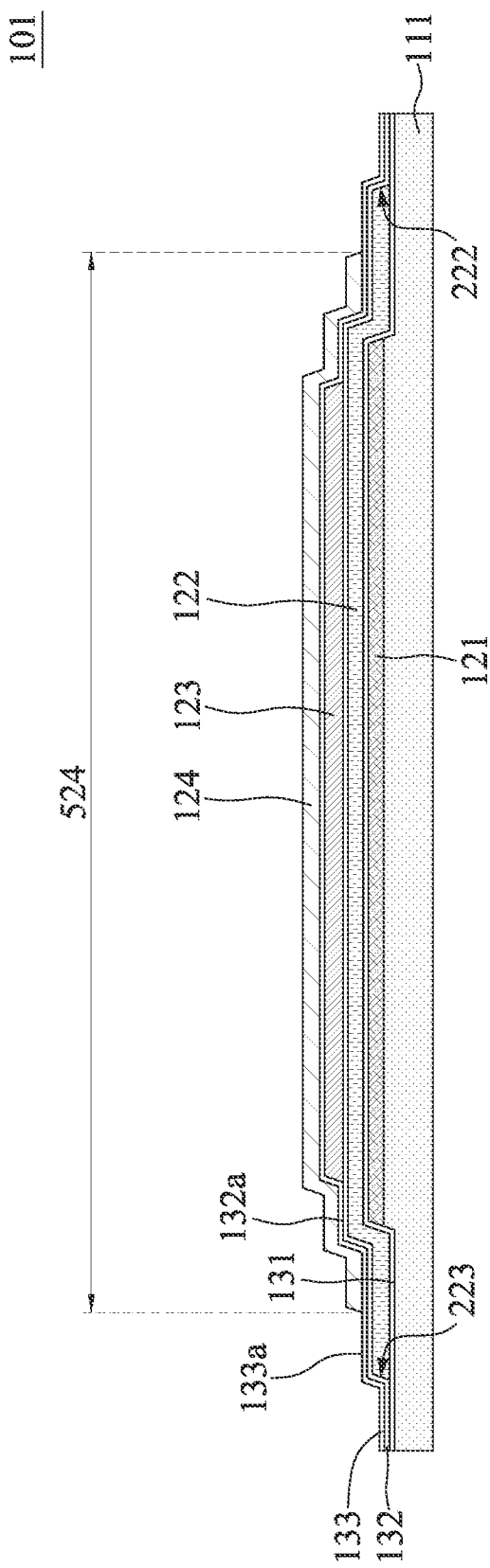

Referring to FIG. 13, operations as depicted in FIG. 8 are performed on the intermediate structure shown in FIG. 12, and a fourth plate 124 is formed over the third plate 123. The fourth plate 124 has a width 524 less than that of the second plate 122 and greater than those of the first plate 121 and the third plate 123. In some embodiments, the width 524 is acquired, defined, or determined prior to a patterning operation during the formation of the fourth plate 124. The fourth plate 124 covers sidewalls (or edges) of the first plate 121 and the third plate 123, and sidewalls 222 and 223 (or edges) of the second plate 122 are not covered by the fourth plate 124. Differences between the widths 521, 522, 523 and 524 are as illustrated in FIG. 1, and repeated description is omitted herein. The fourth plate 124 may cover some of the portion 132a of the second dielectric layer 132. A portion 133a of the third dielectric layer 133 exposed by the fourth plate 124 is damaged by an etching operation during the formation of the fourth plate 124. The portion 133a of the third dielectric layer 133 is sandwiched by portions of the second plate 122 and the fourth plate 124, which are provided with a same voltage bias during operation, and thus there is no issue of current leakage due to an absence of difference of electric potentials of the two adjacent electrodes (i.e., the plates 122 and 124). A plate capacitor 101 similar to the plate capacitor 100 shown in FIG. 1 is thereby formed.

Figure 14:
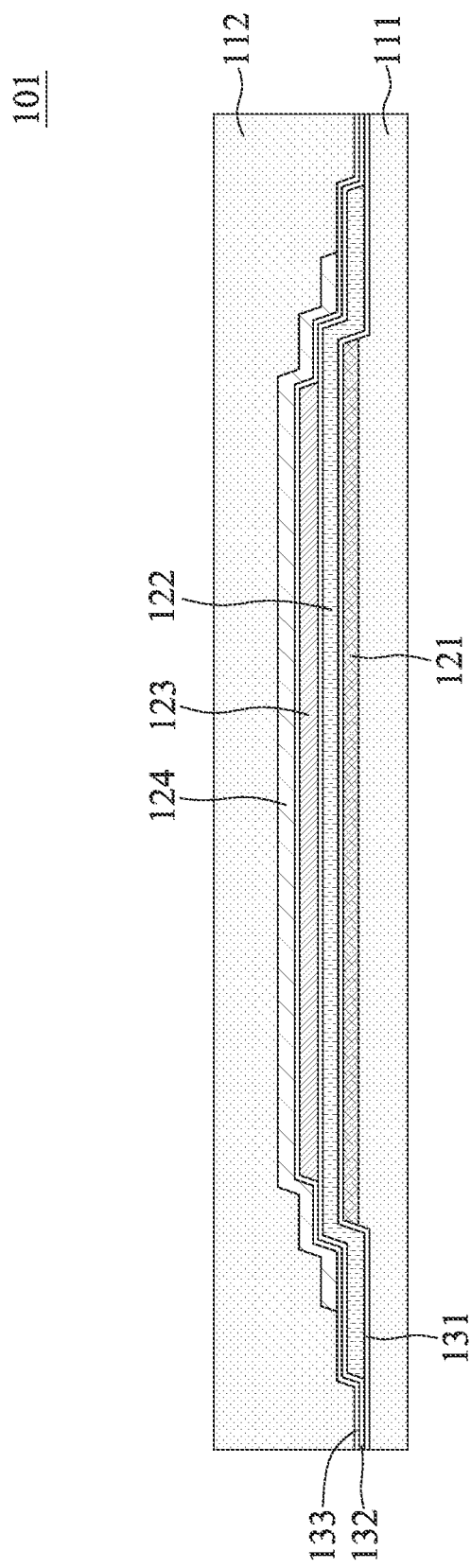

Referring to FIG. 14, an insulating layer 112 is formed over the fourth plate 124. The insulating layer 112 can cover an entirety of the plate capacitor 101. In some embodiments, a material of the insulating layer 112 includes a dielectric material same as that of the substrate 111. In some embodiments, the insulating layer 112 is formed by a deposition followed by a planarization.

Figure 15:
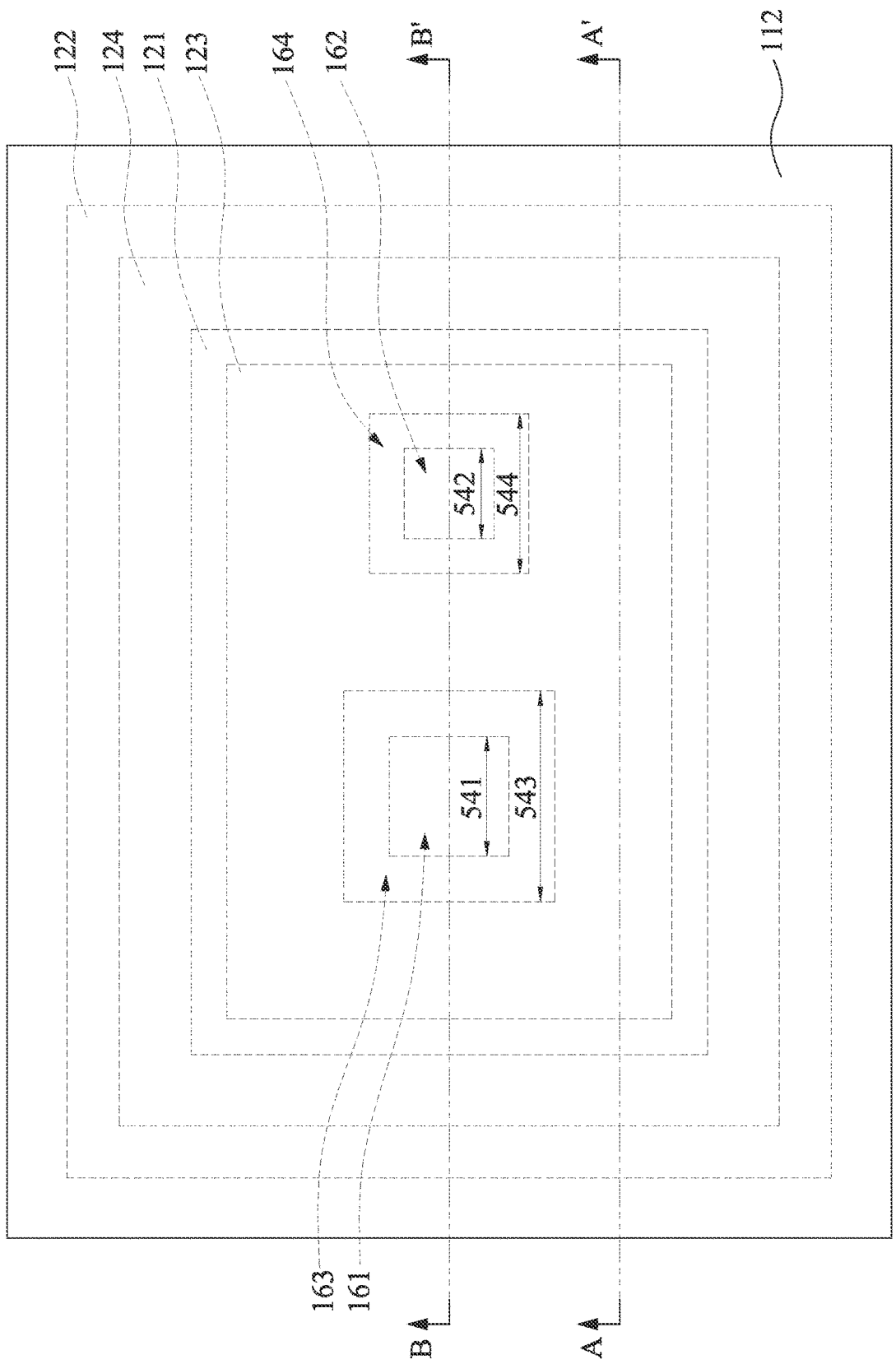
FIG. 15 is a schematic top-view perspective of a plate capacitor in accordance with some embodiments of the disclosure.

Referring to FIG. 15, a schematic top-view perspective of the plate capacitor 101 is provided. In some embodiments, FIGS. 4 to 14 are cross-sections along a line A-A' in FIG. 15 at different stages of the manufacturing method. In order to provide electrical connections to different conductive plates of the plate capacitor 101, openings in the first plate 121, the second plate 122, the third plate 123 and the fourth plate 124 are formed by the respective patterning operations. As shown in FIG. 15, the first plate 121 includes an opening 161; the second plate 122 includes an opening 162; the third plate 123 includes an opening 163; and the fourth plate 124 includes an opening 164. In some embodiments, the opening 163 overlaps the opening 161. In some embodiments, the opening 164 overlaps the opening 162.

Figure 16:
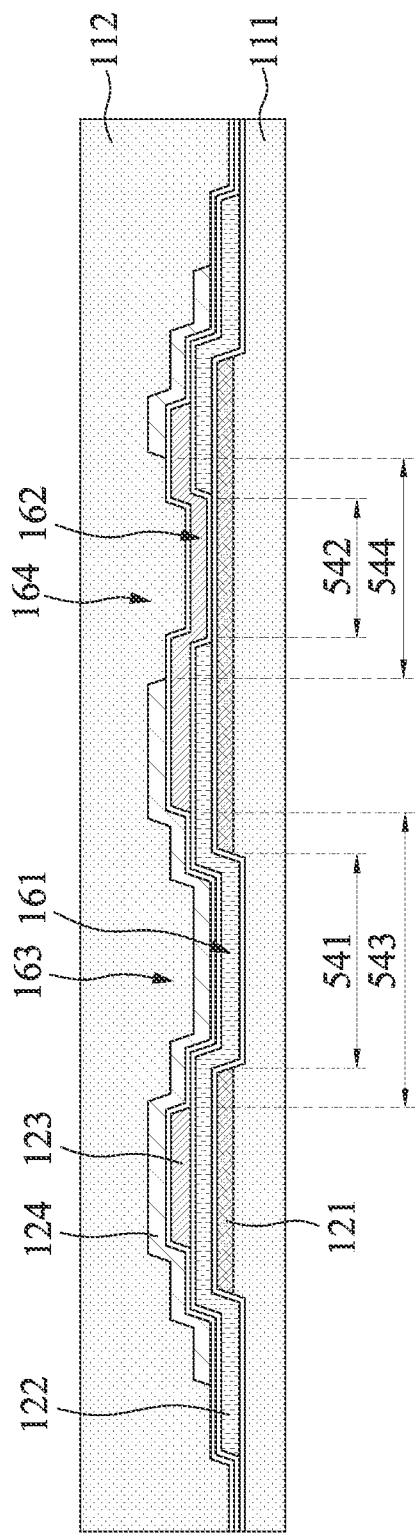
FIGS. 16 to 17 are schematic cross-sectional diagrams along a line B-B' in FIG. 15 at different stages of a method of manufacturing a semiconductor structure.

Referring to FIG. 16, a schematic cross-sectional diagram of the plate capacitor 101 along a line B-B' in FIG. 15 is provided in accordance with some embodiments of the present disclosure. In some embodiments, a portion of the second plate 122 is disposed in and conformal to the opening 161 of the first plate 121. In some embodiments, the second plate 122 fills the opening 161. In some embodiments, a portion of the first plate 121 is exposed through the second plate 122 by the opening 162 of the second plate 122. In some embodiments, the opening 162 does not overlap the opening 161. In some embodiments, the opening 163 of the third plate 123 overlaps the opening 161. In some embodiments, a width 541 of the opening 161 is less than a width 543 of the opening 163. In some embodiments, the opening 161 is within the opening 163 from a top view. In some embodiments, the second plate 122 is disposed in and conformal to the opening 161 of the first plate 121. In some embodiments, the second plate 122 fills the opening 161.

In some embodiments, a portion of the third plate 123 is disposed in and conformal to the opening 162 of the second plate 122. In some embodiments, the third plate 123 fills the opening 162. In some embodiments, a portion of the second plate 122 is exposed through the opening 163 of the third plate 123. In some embodiments, the opening 163 does not overlap the opening 162. In some embodiments, the opening 164 of the fourth plate 124 overlaps the opening 162 of the second plate 122. In some embodiments, a width 542 of the opening 162 is less than a width 544 of the opening 164. In some embodiments, the opening 162 is within the opening 164 from a top view. In some embodiments, the fourth plate 124 is disposed in and conformal to the opening 163 of the third plate 123. In some embodiments, the fourth plate 124 fills the opening 163. In some embodiments, a portion of the third plate 123 is exposed through the fourth plate 124 in the opening 164.

Figure 17:
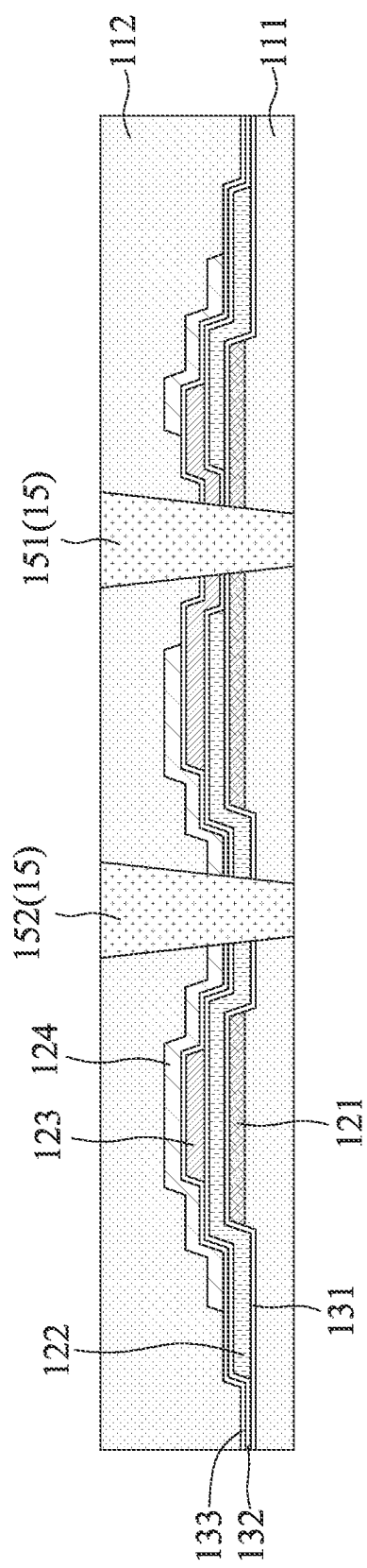
Figure 18:
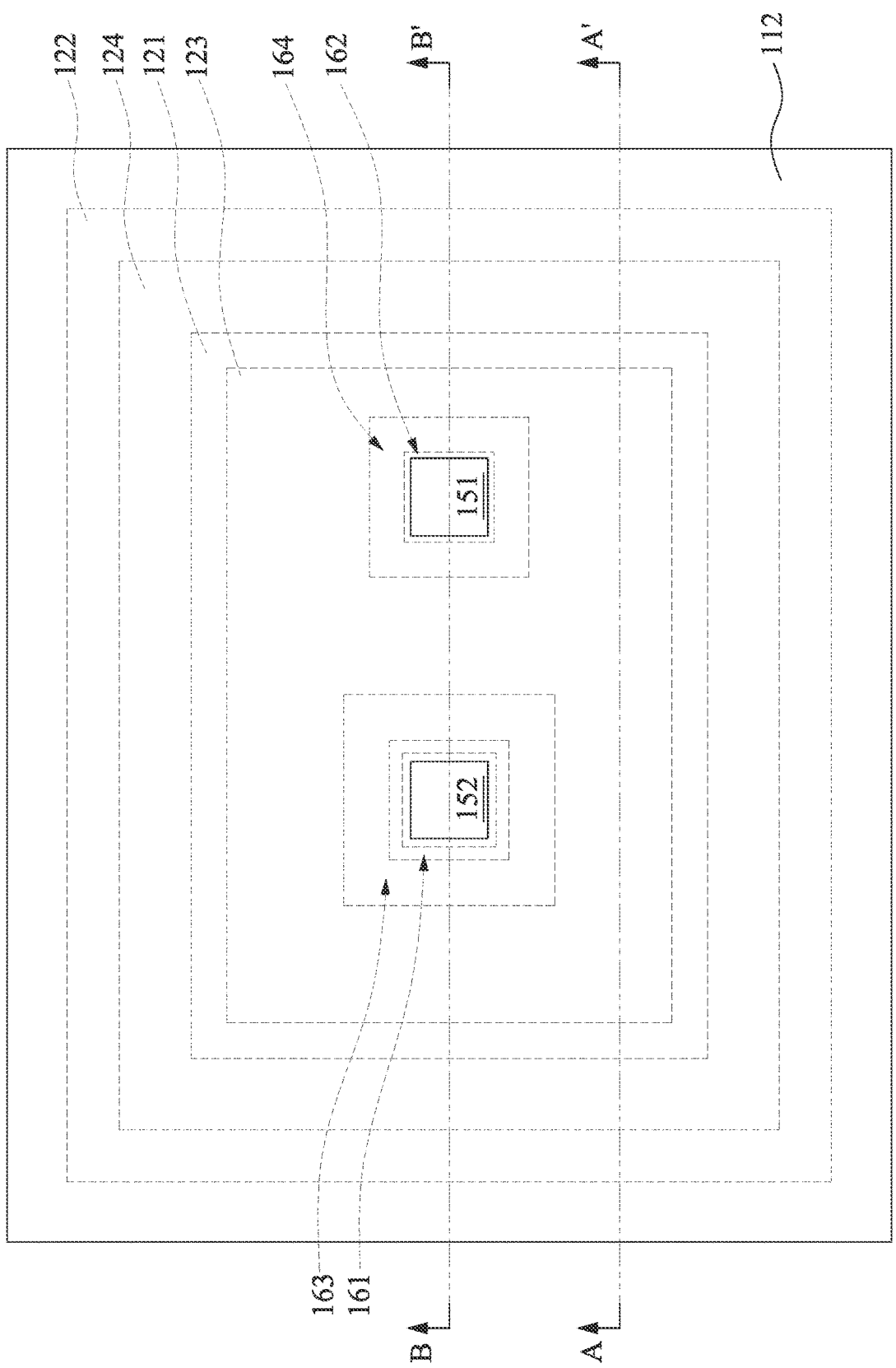
FIG. 18 is a schematic top-view perspective of the semiconductor structure shown in FIG. 17.

Referring to FIGS. 17 and 18, a plurality of conductive plugs 15 are formed and electrically connect to different plates of the plate capacitor 101, wherein FIG. 17 is a cross-sectional diagram and FIG. 18 is a top-view perspective at a stage of the manufacturing method. In some embodiments, the formation of the conductive plugs 15 includes an etching operation followed by a deposition of a conductive material. A planarization is optionally performed after the deposition of the conductive material. Each of the conductive plugs 15 may include one or more layers of conductive materials. In some embodiments, a plug 151 of the conductive plugs 15 electrically connects to the first plate 121 and the third plate 123. In some embodiments, the plug 151 is aligned with the openings 162 and 164. In some embodiments, the plug 151 is disposed in the openings 162 and 164. In some embodiments, an entirety of the plug 151 is disposed within the opening 162 from a top view. In some embodiments, the plug 151 penetrates the insulating layer 112, the third dielectric layer 133, the third plate 123, the second dielectric layer 132, the first dielectric layer 131, the first plate 121 and the substrate 111.

In some embodiments, a plug 152 of the conductive plugs 15 electrically connects to the second plate 122 and the fourth plate 124. In some embodiments, the plug 152 is aligned with the openings 161 and 163. In some embodiments, the plug 152 is disposed in the openings 161 and 163. In some embodiments, an entirety of the plug 152 is disposed within the opening 161 from a top view. In some embodiments, the plug 152 penetrates the insulating layer 112, the fourth dielectric layer 134, the third dielectric layer 133, the second dielectric layer 132, the second plate 122, the first dielectric layer 131 and the substrate 111. Different biases or voltages can be provided to the plugs 151 and 152. In some embodiments, the first plate 121 and the third plate 123 are positive electrodes, and the second plate 122 and the fourth plate 124 are negative electrodes. In some embodiments, the first plate 121 and the third plate 123 are negative electrodes, and the second plate 122 and the fourth plate 124 are positive electrodes.

It should be noted that a plate electrically connecting to which plug depends on a designation of electrical connections according to different applications. A number of conductive plugs 15 also depends on different requirements. In some embodiment, the first plate 121, the first dielectric layer 131 and the second plate 122 together define a first plate capacitor. In some embodiments, the third plate 123, the third dielectric layer 133, and the fourth plate 124 together define a second plate capacitor disposed over and separated from the first plate capacitor by the second dielectric layer 132. A number of plate capacitors and a type of electrical connection (e.g., serial connection or parallel connection) can be adjusted according to different applications.

In the embodiments illustrated above, the plate capacitor 100 or 101 includes an even number of conductive plates. In alternative embodiments, the present disclosure provides a plate capacitor including an odd number of conductive plates.

Figure 19:
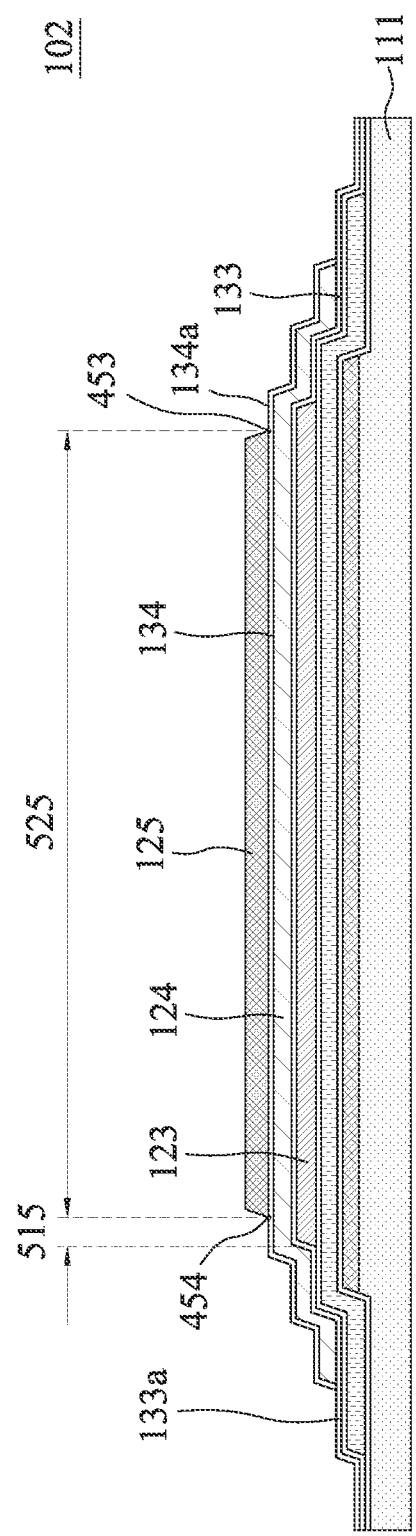
FIGS. 19 to 20 are schematic cross-sectional diagrams at different stages of a method of manufacturing a semiconductor structure in accordance with some embodiments of the disclosure.

Referring to FIG. 19, a plate capacitor 102 in accordance with some embodiments of the present disclosure is provided. The plate capacitor 102 is similar to the plate capacitor 101. In some embodiments, operations as depicted in FIGS. 10 and 11 are performed on the structure shown in FIG. 13 to form a fourth dielectric layer 134 and a fifth plate 125. In some embodiments, the fourth dielectric layer 134 is formed over and conformal to the fourth plate 124, the second plate 122 and the substrate 111. In some embodiments, the fourth dielectric layer 134 can be formed by PVD, CVD, PECVD, ALD, or any other suitable process. In some embodiments, a thickness of the fourth dielectric layer 134 can be substantially equal to that of the first dielectric layer 131, the second dielectric layer 132 or the fourth dielectric layer 134 depending on requirements. In some embodiments, the thickness of the fourth dielectric layer 134 is in a range of 10 to 200 Å. In some embodiments, a material of the fourth dielectric layer 134 includes one or more of the materials in the selection of the first dielectric layer 131 as listed above, and repeated description is omitted herein. In some embodiments, the fourth dielectric layer 134 does not include aluminum. In some embodiments, the fourth dielectric layer 134 is referred to as a fourth high-k dielectric layer 134. In some embodiments, the fourth dielectric layer 134 contacts the third dielectric layer 133. More specifically, the fourth dielectric layer 134 contacts the portion 133a of the third dielectric layer 133. In some embodiments, the fourth dielectric layer 134 is formed across the entire substrate 111.

The fifth plate 125 has a width 525 less than that of the fourth plate 124 and covers only a portion of the fourth plate 124. In some embodiments, the width 525 is less than that of the third plate 123 and overlaps only a portion of the third plate 123. A horizontal distance 515 between an edge of the fifth plate 125 and the edge of the third plate 123 is in a range of 0.05 to 0.15 μm. In some embodiments, a portion 134a of the fourth dielectric layer 134 exposed by the fifth plate 125 is damaged by an etching operation during the formation of the fifth plate 125. The portion 134a of the fourth dielectric layer 134 exposed by the fifth plate 125 results in a possible pathway of current leakage between the fourth plate 124 and the fifth plate 125, especially at lower corners 453 and 454 of the fifth plate 125 which are adjacent to interfaces of the damaged portion 134a and an undamaged portion of the fourth dielectric layer 134 covered by the fifth plate 125.

Figure 20:
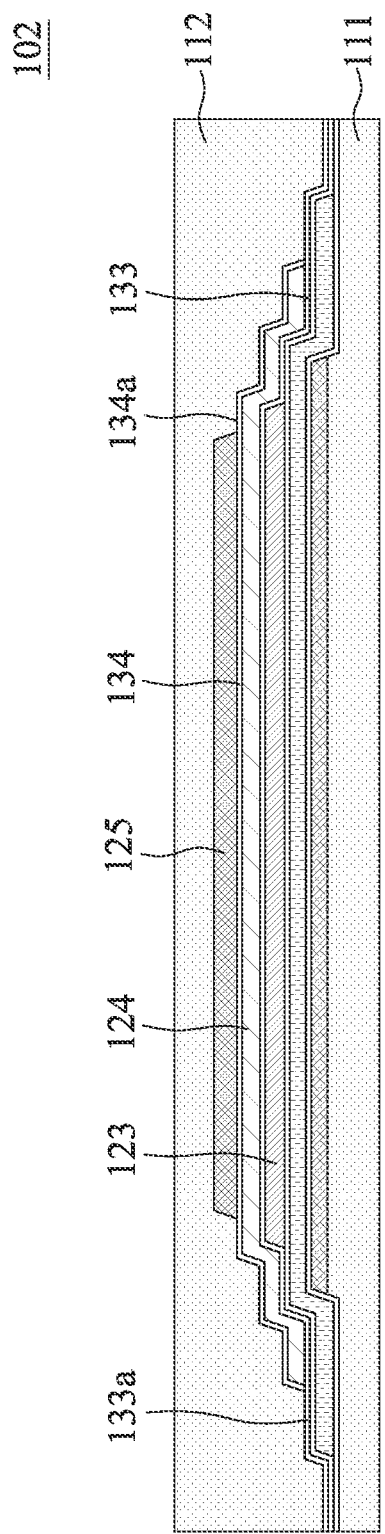

Referring to FIG. 20, operations as depicted in FIG. 14 are performed on the structure shown in FIG. 19 to form an insulating layer 112 covering the plate capacitor 102. In some embodiments, a material of the insulating layer 112 includes a dielectric material same as that of the substrate 111. In some embodiments, the insulating layer 112 is formed by a deposition followed by a planarization. In some embodiments, the insulating layer 112 covers an entirety of the plate capacitor 102.

Figure 21:
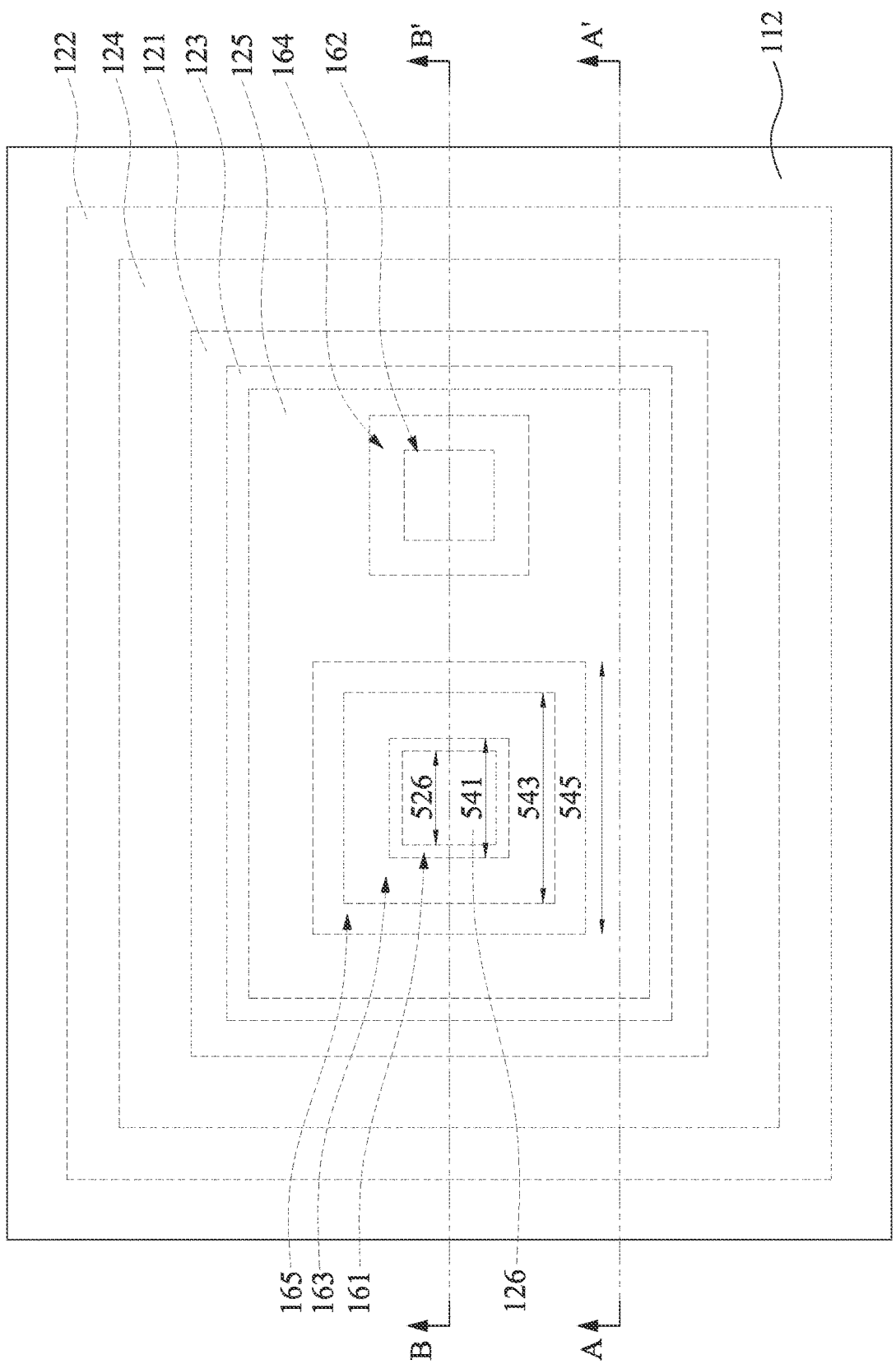
FIG. 21 is a schematic top-view perspective of a plate capacitor shown in FIG. 20 in accordance with some embodiments of the disclosure.

Referring to FIG. 21, a schematic top-view perspective of the plate capacitor 102 is provided. In some embodiments, FIGS. 19 and 20 are cross-sections along a line A-A' in FIG. 21 at different stages of the manufacturing method. In order to provide electrical connections to different conductive plates of the plate capacitor 102, openings 161, 162, 163, 164, and 165 in the first plate 121, the second plate 122, the third plate 123, the fourth plate 124 and the fifth plate 125 respectively are formed by the respective patterning operations. The openings 161, 162, 163 and 164 are similar to those described above and illustrated in FIGS. 15 and 16, and repeated description is omitted herein. In some embodiments, the opening 165 of the fifth plate 125 overlaps the openings 161 and 163. In some embodiments, the openings 161 and 163 are within an area exposed by the opening 165. In some embodiments, a dummy plate 126 is formed concurrently with the fifth plate 125. In some embodiments, the dummy plate 126 is considered as a portion of the fifth plate 125 but does not function as an electrode while the plate capacitor 102 is operating. In some embodiments, the dummy plate 126 is disposed within the opening 161 from a top view. The dummy plate 126 may be electrically isolated from a remaining portion of the fifth plate 125. In some embodiments, the dummy plate 126 is formed by the patterning operation during the formation of the fifth plate 125.

Figure 22:
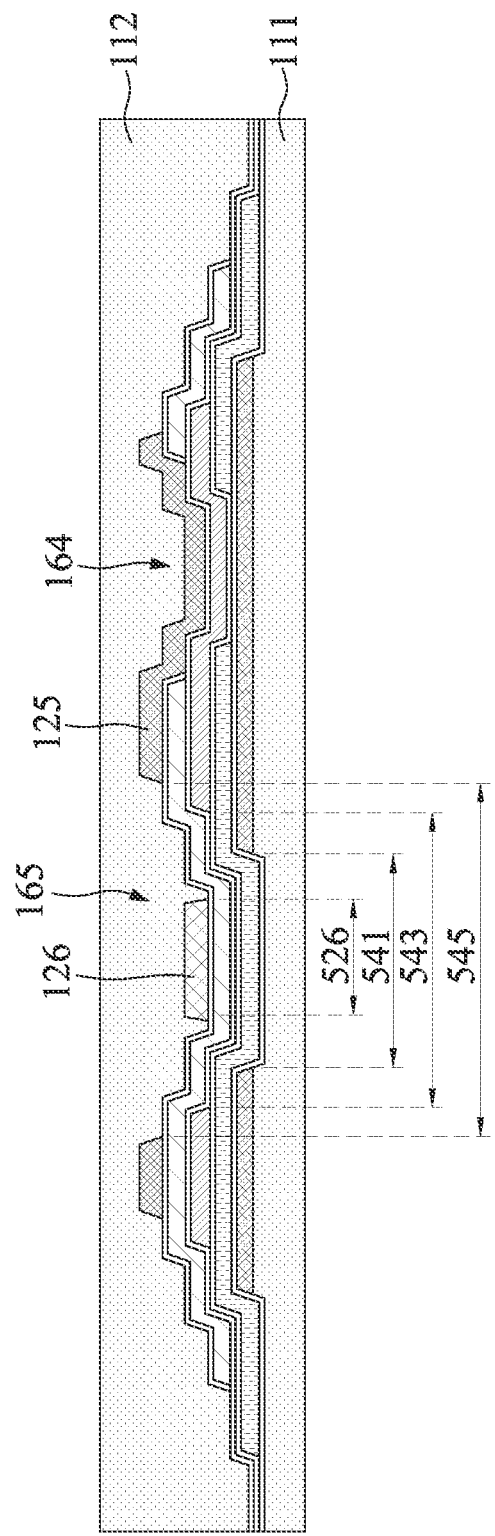
FIGS. 22 to 23 are schematic cross-sectional diagrams along a line B-B' in FIG. 21 at different stages of a method of manufacturing a semiconductor structure.

Referring to FIG. 22, a schematic cross-sectional diagram of the plate capacitor 102 along a line B-B' in FIG. 21 is provided in accordance with some embodiments of the present disclosure. In some embodiments, a portion of the fifth plate 125 is disposed in and conformal to the opening 164 of the fourth plate 124. In some embodiments, the fifth plate 125 fills the opening 164. In some embodiments, a portion of the fourth plate 124 is exposed through the opening 165 in the fifth plate 125 and the dummy plate 126. In some embodiments, the opening 165 does not overlap the opening 164. In some embodiments, a width 545 of the opening 165 is substantially greater than a width 543 of the opening 163. In some embodiments, a width 526 of the dummy plate 126 is less than a width 541 of the opening 161. The dummy plate 126 is to provide a thickness of a conductive material of a conductive plate (e.g., the fifth plate 125) for a purpose of a better etching uniformity.

Figure 23:
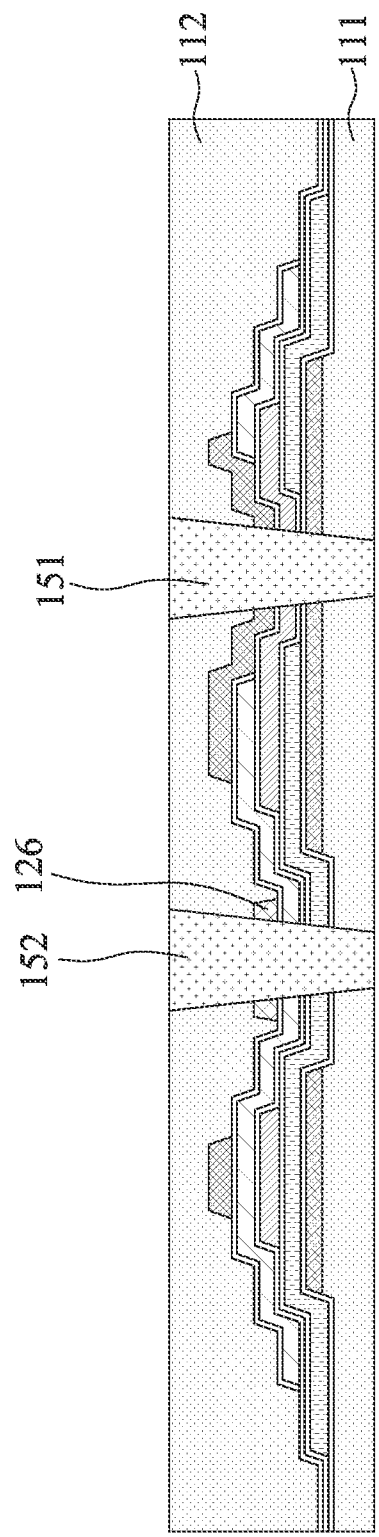
Figure 24:
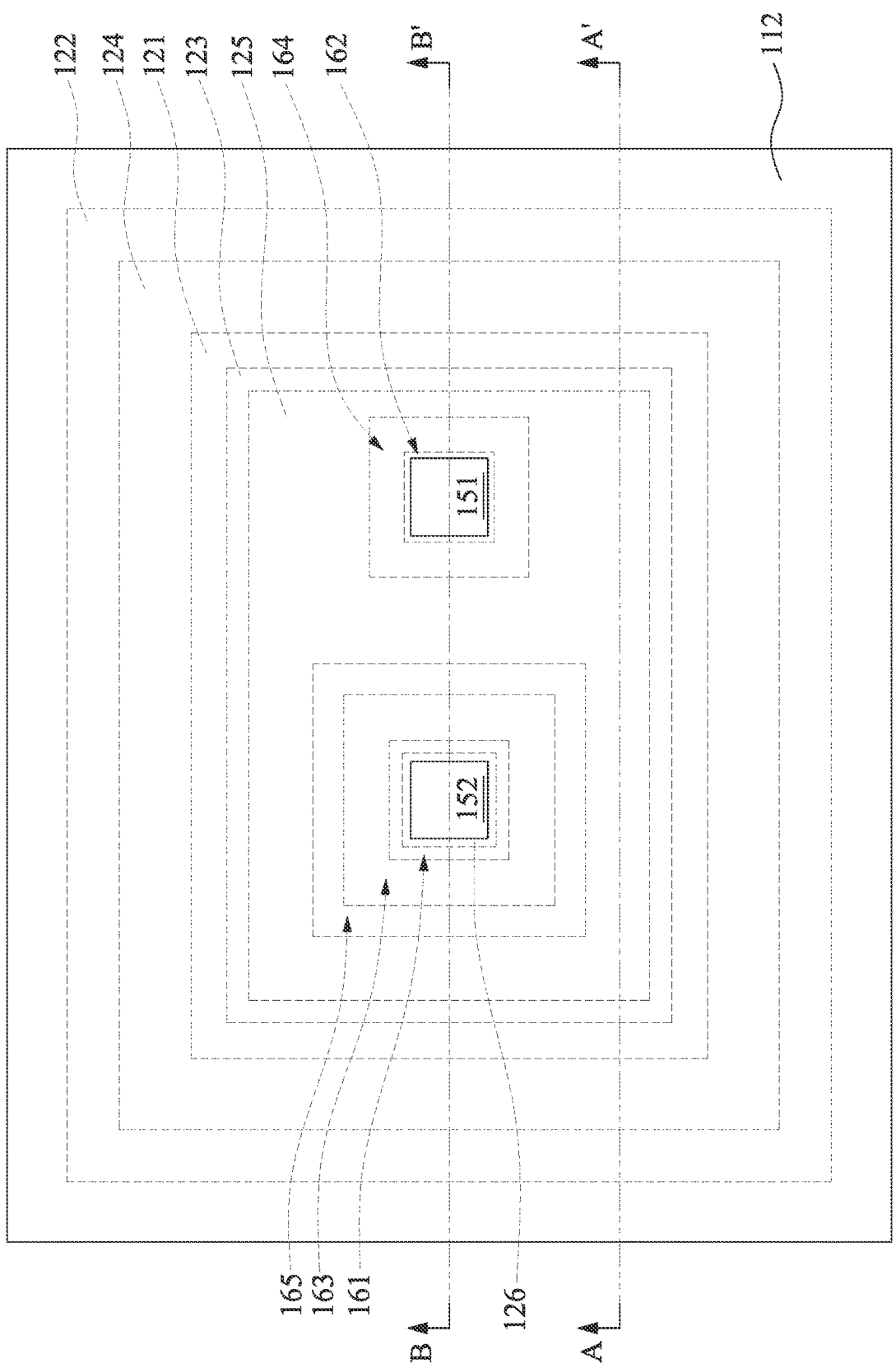
FIG. 24 is a schematic top-view perspective of the semiconductor structure shown in FIG. 23.

Referring to FIGS. 23 and 24, a plurality of conductive plugs 15 are formed and electrically connect to different plates of the plate capacitor 102, wherein FIG. 23 is a cross-sectional diagram and FIG. 24 is a top-view perspective of the structure shown in FIG. 23. The conductive plugs 15 and formation thereof can be similar to those as described above and illustrated in FIGS. 17 and 18. In the embodiments shown in FIG. 23, a plug 151 of the conductive plugs 15 electrically connects to the first plate 121, the third plate 123 and the fifth plate 125, and a plug 152 of the conductive plugs 15 electrically connects to the second plate 122, the fourth plate 124 and the dummy plate 126. The plate capacitor 102 includes an odd number of conductive plates (e.g., 5 conductive plates as shown in FIG. 23), and thus a number of conductive plates connected to a positive bias is different from a number of conductive plates connected to a negative bias. An etching operation for defining positions and configurations of the plugs 151 and 152 during the formation of the conductive plugs 15 can be difficult to control when the etching operation is performed on different regions with different numbers of conductive plates. A material disposed under the substrate 111 can be damaged or over-etched by the etching operation, and a product performance and a product yield can be affected if the dummy plate 126 is absent.

It should be noted that the dummy plate 126 can be formed concurrently with any one of the plates 121, 123 and 125 to achieve the purpose described above. The formation of the dummy plate 126 concurrently with the formation of the fifth plate 125 as described above is for a purpose of illustration, and the present disclosure is not limited thereto. In addition, the width 526 of the dummy plate 126 as described above and illustrated in FIG. 22 is an exemplary embodiment. The width 526 can be greater than the width 541 of the opening 161 or the width 543 of the opening 163 as long as the dummy plate 126 is physically separated or electrically isolated from the fifth plate 125.

As described above, current leakage can easily occur if an interface of damaged and undamaged dielectric materials is disposed between positive and negative electrodes of a plate capacitor. Electrical breakdown can easily occur at upper corners of an electrode when such upper corners are covered by another electrode having a different voltage bias. (For ease of illustration, such upper corners are referred to as weakness points in the following description.) A greater number of weakness points may result in a higher possibility of electrical breakdown. In order to improve an overall performance of a plate capacitor, the present disclosure provides a capacitor structure including some electrodes (or plates) having upper corners exposed to a subsequently-formed electrode and some electrodes (or plates) having upper corners covered by the subsequently-formed electrode. Therefore, issues of current leakage and results of TDDB and VBD can be optimized, and an overall performance of a plate capacitor and a product yield of a semiconductor device can be improved.

In an advanced generation of a semiconductor device, a thickness of a dielectric layer between adjacent conductive plates of a plate capacitor is reduced due to size reduction of the semiconductor device. A dielectric material of the dielectric layer having a higher capacitance is required due to the reduction in the thickness of the dielectric layer. It is found that a high-k material without aluminum intend to have a greater capacitance and a smaller bandgap volume compared to those of the high-k materials including aluminum. If the high-k material without aluminum is used as the dielectric layer, the issue of the electrical breakdown can more easily occur due to smaller bandgap. The plate capacitor of the present disclosure can improve an overall performance of the plate capacitor of the semiconductor device in the advanced generation.

Figure 25:
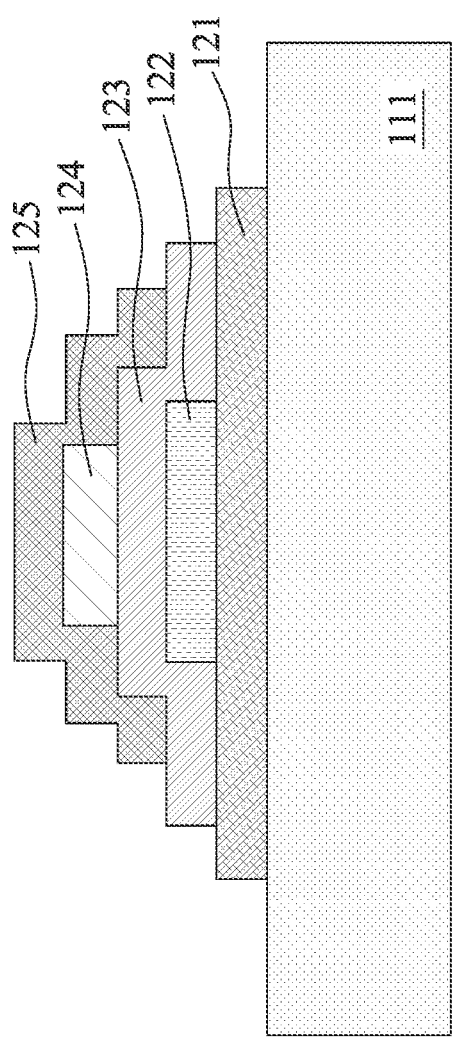
FIGS. 25 to 26 are schematic cross-sectional diagrams of different semiconductor structures in accordance with different embodiments of the present disclosure.

FIG. 25 is a schematic cross-sectional diagram of a plate capacitor 103 in accordance with some embodiments of the present disclosure. The plate capacitor 103 is similar to the plate capacitor 100, 101 or 102 but has a first plate 121 being a largest plate of the plate capacitor 103. Under the same concept as those described above, the plate capacitor 103 includes a plurality of large plates 121, 123 and 125, and a plurality of small plates 122 and 124. The large plates 121, 123 and 125 and the small plates 122 and 124 are alternately arranged, and each of the large plates 121, 123 and 125 covers upper corners of a lower small plate. In addition, sizes of the large plates 121, 123 and 125 are progressively reduced from a size of a substrate 111; and sizes of the small plates 122 and 124 are also progressively reduced from the size of the substrate 111. Therefore, the plate capacitor 103 has a tapered configuration from the substrate 111. It should be noted that dielectric layers between adjacent plates 121, 122, 123, 124 and 125 are omitted in FIG. 25 for a purpose of simplicity and ease of illustration.

Figure 26:
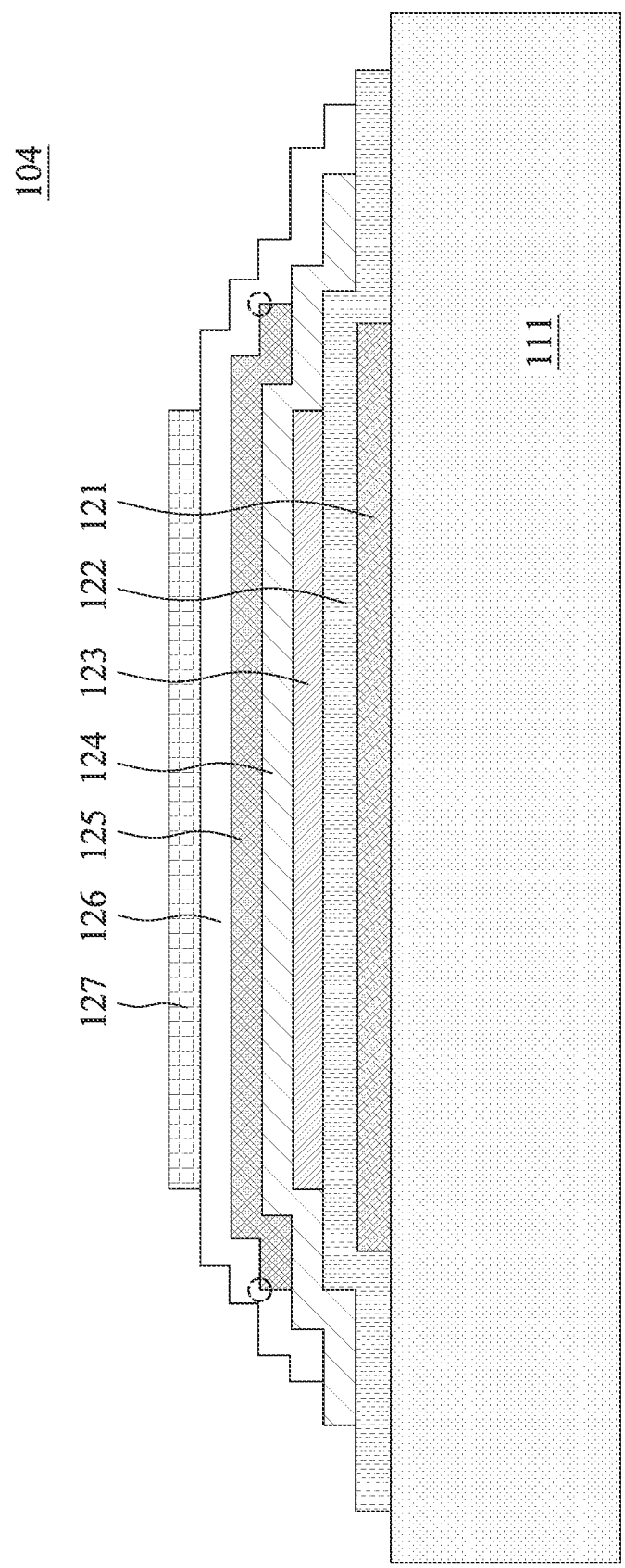

FIG. 26 is a schematic cross-sectional diagram of a plate capacitor 104 in accordance with some embodiments of the present disclosure. The plate capacitor 104 is similar to the plate capacitor 100, 101 or 102 but has a fifth plate 125 that is larger than a third plate 123. The plate capacitor 100, 101, 102 and 103 are tapered from the substrate 111 for a purpose of minimizing a number of weakness points. On the other hand, the plate capacitor 104 may have additional weakness points (as indicated by dotted circles) on the fifth plate 125, but a capacitance can be improved due to a greater coverage area of the fifth plate 125. In some embodiments, the plate capacitor 104 further includes a sixth plate 126 disposed over the fifth plate 125 and having a width greater than that of the fifth plate 125 and less than that of the second plate 122. In some embodiments, the plate capacitor 104 further includes a seventh plate 127 disposed over the sixth plate 126 and having a width substantially equal to that of a third plate 123 as shown in FIG. 26. The plate capacitor 104 can optionally include a greater number of conductive plates for a purpose of a greater capacitance depending on requirements. For instance, a fourth plate 124, the fifth plate 125 and the sixth plate 126 can be repeatedly formed over the seventh plate 127 to enhance a capacitance of the plate capacitor 104. The plate capacitor 104 may not have a tapered configuration but a columnar configuration, and thus the capacitance can be improved especially when the plate capacitor 104 includes more than 5 plates. It should be noted that dielectric layers between adjacent plates 121, 122, 123, 124, 125, 126 and 127 are omitted in FIG. 26 for a purpose of simplicity and ease of illustration.

To conclude the operations as illustrated in FIGS. 4 to 18 and 19 to 24 above, a method 600 and a method 700 within a same concept of the present disclosure are provided.

Figure 27:
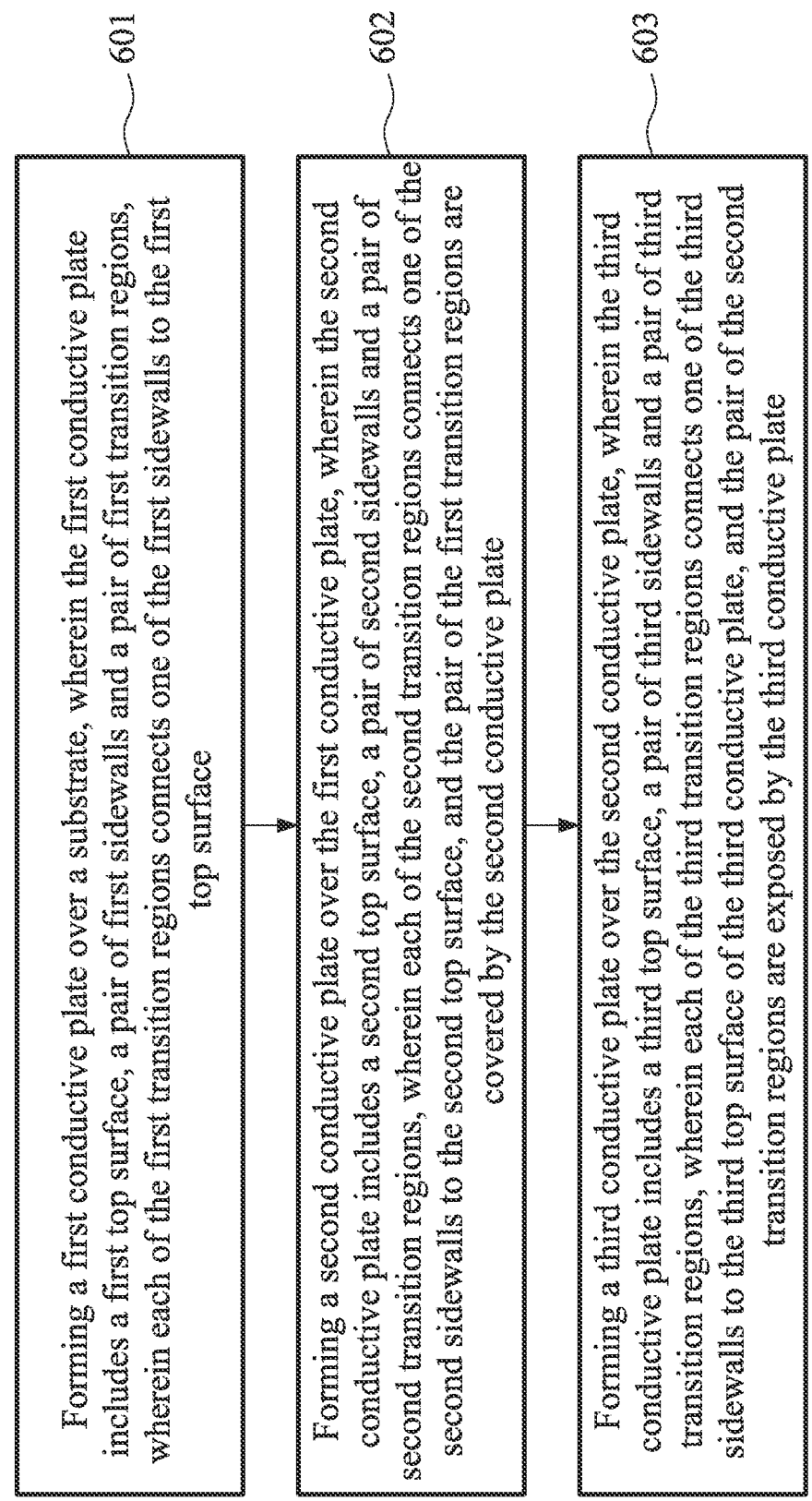
FIGS. 27 and 28 are flow diagrams of methods of manufacturing a semiconductor structure in accordance with different embodiments of the present disclosure.

FIG. 27 is a flow diagram of a method 600 for manufacturing a semiconductor structure in accordance with some embodiments of the present disclosure. The method 600 includes a number of operations (601, 602 and 603) and the description and illustration are not deemed as a limitation to the sequence of the operations. A first conductive plate is formed over a substrate in the operation 601, wherein the first conductive plate includes a first top surface, a pair of first sidewalls and a pair of first transition regions, wherein each of the first transition regions connects one of the first sidewalls to the first top surface. A second conductive plate is formed over the first conductive plate in the operation 602, wherein the second conductive plate includes a second top surface, a pair of second sidewalls and a pair of second transition regions, wherein each of the second transition regions connects one of the second sidewalls to the second top surface, and the pair of the first transition regions are covered by the second conductive plate. A third conductive plate is formed over the second conductive plate in the operation 603, wherein the third conductive plate includes a third top surface, a pair of third sidewalls and a pair of third transition regions, wherein each of the third transition regions connects one of the third sidewalls to the third top surface of the third conductive plate, and the pair of the second transition regions are exposed by the third conductive plate.

Figure 28:
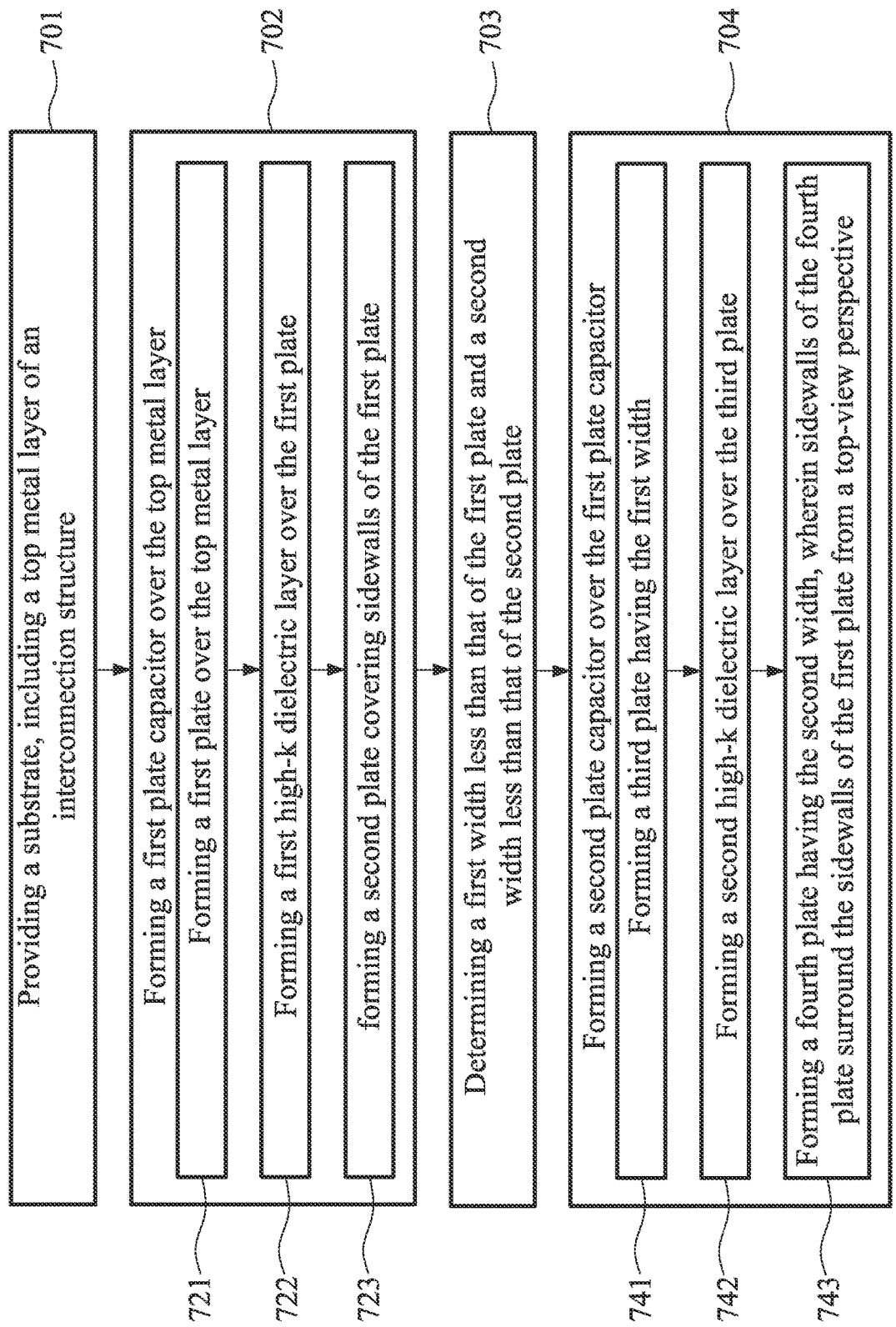

FIG. 28 is a flow diagram of a method 700 for manufacturing a semiconductor structure in accordance with some embodiments of the present disclosure. The method 700 includes a number of operations (701, 702, 703 and 704) and the description and illustration are not deemed as a limitation to the sequence of the operations. A substrate is provided in the operation 701, wherein the substrate includes a top metal layer of an interconnection structure. A first plate capacitor is formed over the top metal layer in the operation 702. The operation 702 includes several steps 721, 722 and 723. A first plate is formed over the top metal layer in the step 721. A first high-k dielectric layer is formed over the first plate in the step 722. A second plate covering sidewalls of the first plate is formed in the step 723. A first width less than a width of the first plate and a second width less than a width of the second plate are determined in the operation 703. A second plate capacitor is formed over the first plate capacitor in the operation 704. The operation 704 may include multiple steps 741, 742 and 743. A third plate having the first width is formed in the step 741. A second high-k dielectric layer is formed over the third plate in the step 742. A fourth plate having the second width is formed in the step 743, wherein sidewalls of the fourth plate surround the sidewalls of the first plate from a top-view perspective.

It should be noted that the operations of the method 600 and/or the method 700 may be rearranged or otherwise modified within the scope of the various aspects. Additional processes may be provided before, during, and after the method 600 and/or the method 700, and some other processes may be only briefly described herein. Thus, other implementations are possible within the scope of the various aspects described herein.

In accordance with some embodiments of the disclosure, a method for manufacturing a semiconductor structure is provided. The method may include several operations. A first conductive plate is formed over a substrate, wherein the first conductive plate includes a first top surface, a pair of first sidewalls and a pair of first transition regions, and each of the first transition regions connects each of the first sidewalls to the first top surface. A second conductive plate is formed over the first conductive plate, wherein the second conductive plate includes a second top surface, a pair of second sidewalls and a pair of second transition regions; each of the second transition regions connects each of the second sidewalls to the second top surface; and the pair of the first transition regions are covered by the second conductive plate. A third conductive plate is formed over the second conductive plate, wherein the third conductive plate includes a third top surface, a pair of third sidewalls and a pair of third transition regions, wherein each of the third transition regions connects each of the third sidewalls to the third top surface of the third conductive plate, and the pair of the second transition regions are exposed through the third conductive plate.

In accordance with some embodiments of the disclosure, a method for manufacturing a semiconductor structure is provided. The method may include several operations. A substrate is provided, wherein the substrate includes a top metal layer of an interconnection structure. A first plate capacitor is formed over the top metal layer. The formation of the first plate capacitor includes several steps: a first plate is formed over the top metal layer; a first high-k dielectric layer is formed over the first plate; and a second plate covering sidewalls of the first plate is formed. A first width less than that of the first plate and a second width less than that of the second plate are acquired. A second plate capacitor over the first plate capacitor is formed. The formation of the second plate may include: a third plate having the first width is formed; a second high-k dielectric layer over the third plate is formed; and a fourth plate having the second width is formed, wherein sidewalls of the fourth plate surrounds the sidewalls of the first plate from a top-view perspective.

In accordance with some embodiments of the disclosure, a semiconductor structure is provided. The semiconductor structure includes a first conductive plate, a second conductive plate and a third conductive plate. The first conductive plate is disposed over the substrate, wherein the first conductive plate includes a first top surface, a pair of first sidewalls and a pair of first transition regions, wherein each of the first transition regions connects each of the first sidewalls to the first top surface. The second conductive plate is disposed over the first conductive plate, wherein the second conductive plate includes a second top surface, a pair of second sidewalls and a pair of second transition regions, wherein each of the second transition regions connects each of the second sidewalls to the second top surface, and the pair of the first transition regions are surrounded by the pair of the second transition regions. The third conductive plate is disposed over the second conductive plate, wherein the third conductive plate includes a third top surface, a pair of third sidewalls and a pair of third transition regions, wherein each of the third transition regions connects each of the third sidewalls to the third top surface, and the pair of the third transition regions are surrounded by the pair of the first transition regions.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a semiconductor structure, comprising:
   forming a first conductive plate over a substrate, wherein the first conductive plate includes a first top surface, a pair of first sidewalls and a pair of first transition regions, wherein each of the first transition regions connects one of the first sidewalls to the first top surface;
   forming a second conductive plate over the first conductive plate, wherein the second conductive plate includes a second top surface, a pair of second sidewalls and a pair of second transition regions, wherein each of the second transition regions connects one of the second sidewalls to the second top surface, and the pair of the first transition regions are covered by the second conductive plate; and
   forming a third conductive plate over the second conductive plate, wherein the third conductive plate includes a third top surface, a pair of third sidewalls and a pair of third transition regions, wherein each of the third transition regions connects one of the third sidewalls to the third top surface of the third conductive plate, and the pair of the second transition regions are exposed by the third conductive plate.

2. The method of claim 1, wherein a first width of the first conductive plate is less than a second width of the second conductive plate and greater than a third width of the third conductive plate.

3. The method of claim 1, further comprising:
   forming a fourth conductive plate over the third conductive plate, wherein the pair of the third transition regions, the pair of the second transition regions and the pair of the first transition regions are covered by the fourth conductive plate.

4. The method of claim 1, further comprising:
   forming a fourth conductive plate prior to the formation of the first conductive plate, wherein the fourth conductive plate includes a fourth top surface, a pair of fourth sidewalls and a pair of fourth transition regions, wherein each of the fourth transition regions connects one of the fourth sidewalls to the fourth top surface, and the pair of the fourth transition regions are exposed by the second conductive plate.

5. The method of claim 1, further comprising:
forming a first high-k dielectric layer over the first conductive plate;
forming a second high-k dielectric layer over the second conductive plate; and
forming an interlayer dielectric (ILD) layer over the third conductive plate.

6. The method of claim 5, wherein aluminum is absent in the first high-k dielectric layer or the second high-k dielectric layer.

7. The method of claim 1, wherein the pair of first sidewalls of the first conductive plate is tilted.

8. The method of claim 7, wherein an angle between the pair of first sidewalls of the first conductive plate and the horizontal direction is in a range of 30 to 70 degrees.

9. A method of manufacturing a semiconductor structure, comprising:
providing a substrate, including a top metal layer of an interconnection structure;
forming a first plate capacitor over the top metal layer, comprising:
  forming a first plate over the top metal layer;
  forming a first high-k dielectric layer over the first plate; and
  forming a second plate covering sidewalls of the first plate;
determining a first width less than a width of the first plate and a second width less than a width of the second plate; and
forming a second plate capacitor over the first plate capacitor, comprising:
  forming a third plate having the first width;
  forming a second high-k dielectric layer over the third plate; and
  forming a fourth plate having the second width, wherein sidewalls of the fourth plate surround the sidewalls of the first plate from a top-view perspective.

10. The method of claim 9, further comprising:
forming a redistribution layer (RDL) over the plurality of plate capacitors.

11. The method of claim 9, wherein the first width is less than the width of the first plate by 0.05 to 0.15 microns.

12. The method of claim 9, wherein the width of the second plate is greater than the second width by at least 0.05 microns.

13. The method of claim 9, wherein a thickness of the first plate or the second plate is in a range of 100 to 800 angstroms.

14. The method of claim 9, wherein a thickness of the first high-k dielectric layer or the second high-k dielectric layer is in a range of 10 to 200 angstroms.

15. The method of claim 9, further comprising:
forming a dielectric layer over the top metal layer; and
removing a surficial portion of the dielectric layer during the formation of the first plate.

16. The method of claim 15, wherein a portion of the dielectric layer exposed through the first plate is indented by 50 to 300 angstroms.

17. The method of claim 9, further comprising:
forming a first conductive plug electrically connecting the first plate and the third plate; and
forming a second conductive plug electrically connecting the second plate and the fourth plate.

18. A semiconductor structure, comprising:
a first conductive plate, disposed over a substrate, wherein the first conductive plate includes a first top surface, a pair of first sidewalls and a pair of first transition regions, wherein each of the first transition regions connects one of the first sidewalls to the first top surface;
a second conductive plate, disposed over the first conductive plate, wherein the second conductive plate includes a second top surface, a pair of second sidewalls and a pair of second transition regions, wherein each of the second transition regions connects one of the second sidewalls to the second top surface, and the pair of the first transition regions are surrounded by the pair of the second transition regions; and
a third conductive plate, disposed over the second conductive plate, wherein the third conductive plate includes a third top surface, a pair of third sidewalls and a pair of third transition regions, wherein each of the third transition regions connects one of the third sidewalls to the third top surface, and the pair of the third transition regions are surrounded by the pair of the first transition regions.

19. The semiconductor structure of claim 18, wherein a horizontal distance between a second transition region and a corresponding first transition region is in a range of 100 to 800 angstroms.

20. The semiconductor structure of claim 18, wherein the second conductive plate is conformal to the first conductive plate, and a distance between an edge of the second plate and an edge of the first plate is substantially greater than 0.2 microns.

* * * * *